US012615985B2

(12) United States Patent
Kuribayashi et al.

(10) Patent No.: US 12,615,985 B2
(45) Date of Patent: Apr. 28, 2026

(54) SUBSTRATE PROCESSING APPARATUS, NON-TRANSITORY COMPUTER-READABLE RECORDING MEDIUM, SUBSTRATE PROCESSING METHOD AND METHOD OF MANUFACTURING SEMICONDUCTOR DEVICE

(71) Applicant: Kokusai Electric Corporation, Tokyo (JP)

(72) Inventors: Koei Kuribayashi, Toyama (JP); Tatsushi Ueda, Toyama (JP); Katsuhiko Yamamoto, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 659 days.

(21) Appl. No.: 17/679,966

(22) Filed: Feb. 24, 2022

(65) Prior Publication Data

US 2022/0301850 A1 Sep. 22, 2022

(30) Foreign Application Priority Data

Mar. 19, 2021 (JP) ................................. 2021-046691

(51) Int. Cl.
| | |
|---|---|
| *H01J 37/32* | (2006.01) |
| *H10P 14/694* | (2026.01) |
| *H10P 70/00* | (2026.01) |

(52) U.S. Cl.
CPC .......... *H10P 70/23* (2026.01); *H01J 37/3244* (2013.01); *H01J 37/32715* (2013.01);
(Continued)

(58) Field of Classification Search
CPC .............. H01L 21/0206; H01L 21/0217; H01J 2237/20214; H01J 37/3244; H01J 37/32715; H01J 37/32862
(Continued)

(56) References Cited

U.S. PATENT DOCUMENTS

| | | | | |
|---|---|---|---|---|
| 5,755,469 | A | * 5/1998 | Choi ................. | H01L 21/68707 |
| | | | | 414/941 |
| 2012/0225566 | A1* | 9/2012 | Hamano ........... | H01J 37/32669 |
| | | | | 257/E21.24 |

(Continued)

FOREIGN PATENT DOCUMENTS

| | | | |
|---|---|---|---|
| JP | 2005353619 | A * | 12/2005 |
| JP | 2017-017104 | A | 1/2017 |

(Continued)

OTHER PUBLICATIONS

TIPO Office Action with English translation in Taiwan Application No. 111103029, issued Oct. 19, 2022, 11 pages.
(Continued)

*Primary Examiner* — Charlee J. C. Bennett
(74) *Attorney, Agent, or Firm* — Edell, Shapiro & Finnan, LLC

(57) ABSTRACT

There is provided a technique capable of cleaning a film deposited on an outer peripheral portion of a substrate placing surface of a substrate support. According to one aspect thereof, a substrate processing apparatus includes: a process chamber where a product substrate is processed; a substrate support provided in the process chamber and provided with a substrate placing surface whereon the product substrate is placed; a process gas supplier wherethrough a process gas is supplied into the process chamber while the product substrate being placed on the substrate placing surface; and a cleaning gas supplier wherethrough a cleaning gas is supplied into the process chamber while a dummy substrate being placed on the substrate placing surface. An outer peripheral portion of the dummy substrate is out of contact with the substrate placing surface in a state where the dummy substrate is placed on the substrate placing surface.

20 Claims, 12 Drawing Sheets

(52) U.S. Cl.
CPC .. *H01J 37/32862* (2013.01); *H10P 14/69433*
(2026.01); *H01J 2237/20214* (2013.01)

(58) Field of Classification Search
USPC ........................................................ 118/715
See application file for complete search history.

(56) References Cited

U.S. PATENT DOCUMENTS

| | | | |
|---|---|---|---|
| 2016/0064219 A1 | 3/2016 | Yamamoto et al. | |
| 2016/0148787 A1 | 5/2016 | Burgess et al. | |
| 2020/0080895 A1 | 3/2020 | Obara et al. | |
| 2020/0141001 A1* | 5/2020 | Kato ................. | C23C 16/45551 |
| 2022/0020628 A1* | 1/2022 | Takahashi ............. | C25D 5/022 |

FOREIGN PATENT DOCUMENTS

| | | |
|---|---|---|
| JP | 2020-077750 A | 5/2020 |
| KR | 10-2012-0016012 A | 2/2012 |
| TW | 201611159 A | 3/2016 |

OTHER PUBLICATIONS

Notice of Reasons for Refusal with English translation in Japanese
Application No. 2021-046691, issued Oct. 18, 2022, 10 pages.
Notice of Opinion Submission with English translation in Korean
Application No. 10-2022-0021965, dated Nov. 20, 2023, 14 pages.

* cited by examiner

200

FIG. 9
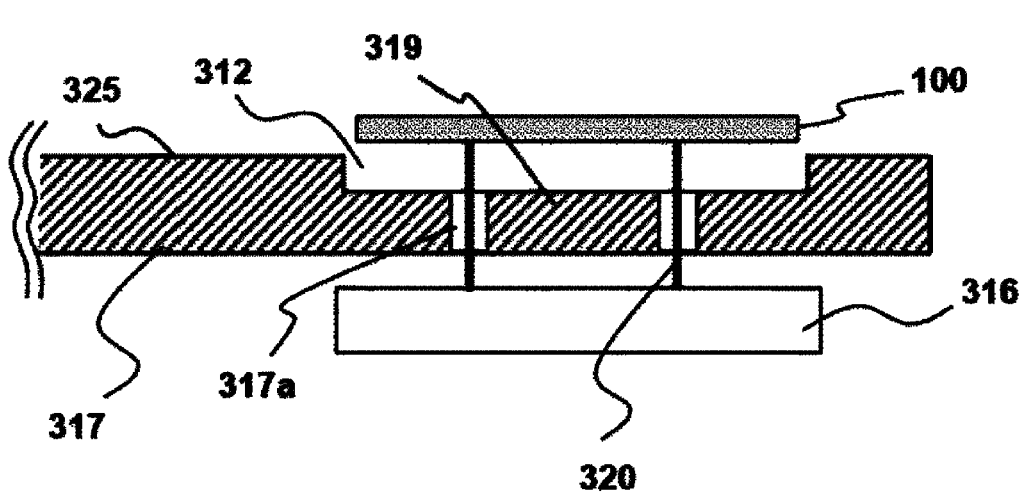
FIG. 10A                                    FIG. 10B
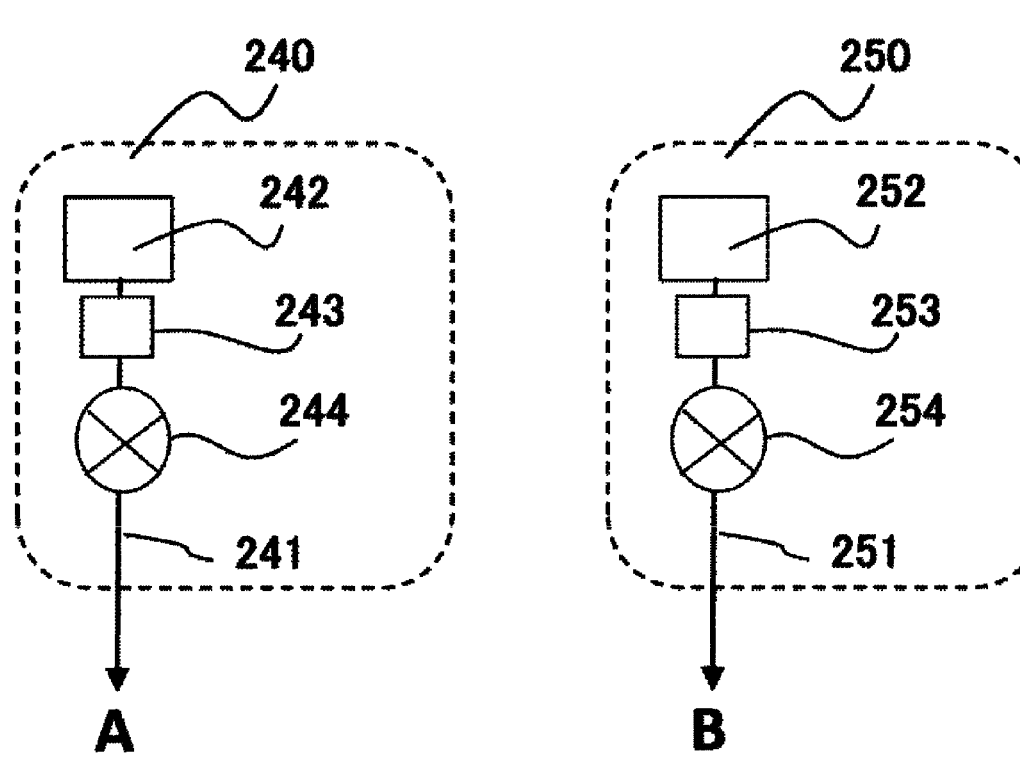
A                                           B

Figure 13:
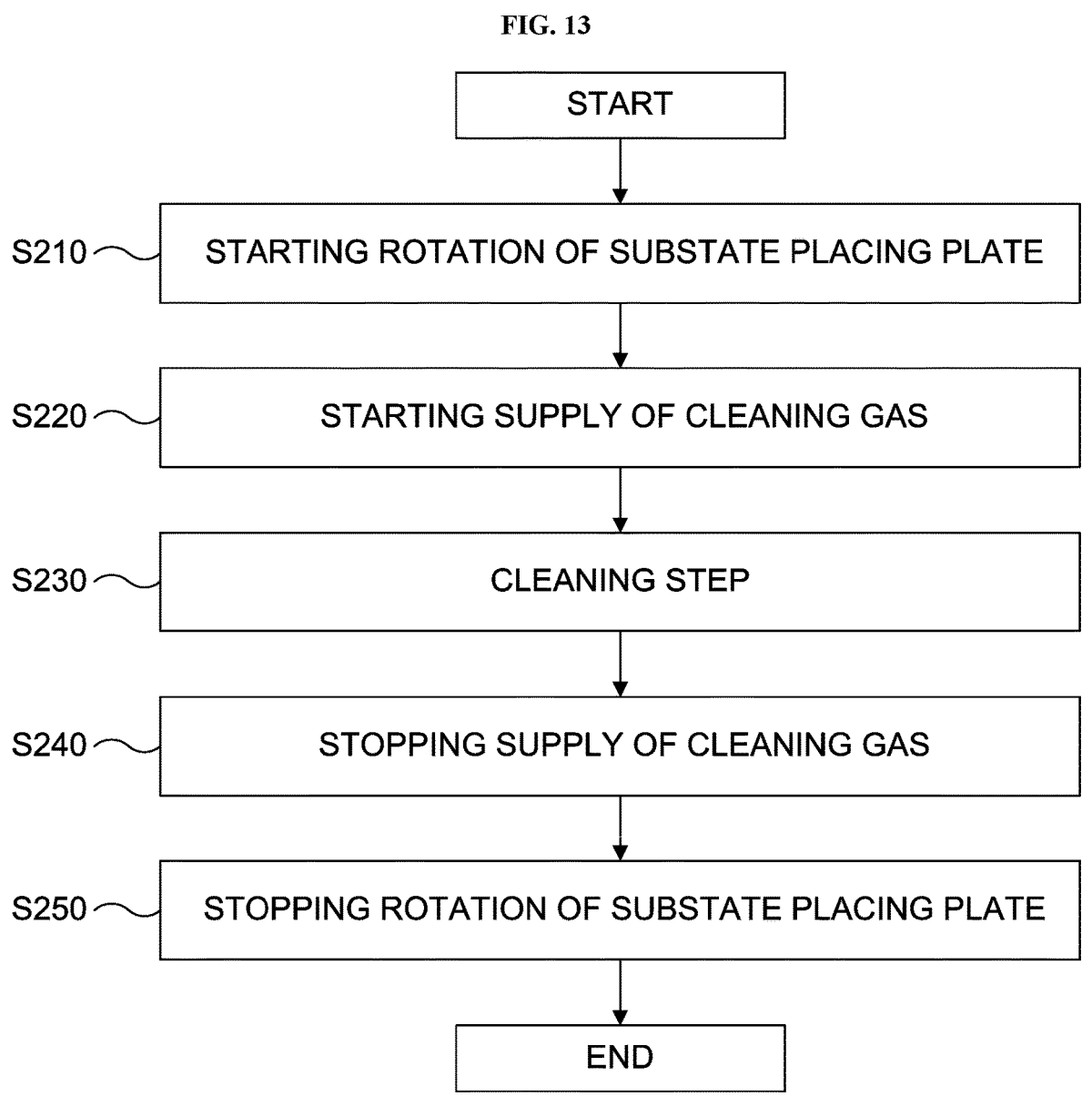

```
                    ┌─────────────────────┐
                    │        START        │
                    └─────────────────────┘
                               │
                               ▼
S210 ──┐  ┌──────────────────────────────────────────────────┐
       └──┤    STARTING ROTATION OF SUBSTATE PLACING PLATE     │
          └──────────────────────────────────────────────────┘
                               │
                               ▼
S220 ──┐  ┌──────────────────────────────────────────────────┐
       └──┤         STARTING SUPPLY OF CLEANING GAS            │
          └──────────────────────────────────────────────────┘
                               │
                               ▼
S230 ──┐  ┌──────────────────────────────────────────────────┐
       └──┤                 CLEANING STEP                     │
          └──────────────────────────────────────────────────┘
                               │
                               ▼
S240 ──┐  ┌──────────────────────────────────────────────────┐
       └──┤         STOPPING SUPPLY OF CLEANING GAS            │
          └──────────────────────────────────────────────────┘
                               │
                               ▼
S250 ──┐  ┌──────────────────────────────────────────────────┐
       └──┤    STOPPING ROTATION OF SUBSTATE PLACING PLATE     │
          └──────────────────────────────────────────────────┘
                               │
                               ▼
                    ┌─────────────────────┐
                    │         END         │
                    └─────────────────────┘
```

SUBSTRATE PROCESSING APPARATUS, NON-TRANSITORY COMPUTER-READABLE RECORDING MEDIUM, SUBSTRATE PROCESSING METHOD AND METHOD OF MANUFACTURING SEMICONDUCTOR DEVICE

CROSS REFERENCE TO RELATED APPLICATIONS

This application claims foreign priority under 35 U.S.C. § 119(a)-(d) to Application No. JP 2021-046691 filed on Mar. 19, 2021, the entire contents of which are hereby incorporated by reference.

TECHNICAL FIELD

The present disclosure relates to a substrate processing apparatus, a non-transitory computer-readable recording medium, a substrate processing method and a method of manufacturing a semiconductor device.

BACKGROUND

A substrate processing apparatus may be used to form a film on a product substrate such as a semiconductor wafer placed on a substrate support of the substrate processing apparatus. In the substrate processing apparatus described above, when the film is formed on the product substrate, the film is also deposited on an exposed portion (which is not in contact with the product substrate) of a surface of the substrate support. Therefore, a technique of cleaning the substrate support (also referred to as a "substrate mounting table" or a "susceptor") has been proposed.

More specifically, when the film is formed on the product substrate, the film is also deposited on an exposed portion (which is not in contact with the product substrate, and is also referred to as "a substrate non-contacting surface") of a substrate placing surface of the substrate support. On the other hand, the film is not deposited on a non-exposed portion (which is in contact with the product substrate, and is also referred to as "a substrate contacting surface") of the substrate placing surface of the substrate support. Therefore, when both the substrate non-contacting surface and the substrate contacting surface of the substrate support are uniformly cleaned, an excessive cleaning may occur on the substrate contacting surface of the substrate support.

On the other hand, since an outer peripheral portion of the substrate contacting surface is not completely blocked from a process gas, the film may be gradually deposited on the outer peripheral portion of the substrate contacting surface. When a dummy substrate of the same shape as the product substrate is placed on the substrate placing surface and a cleaning process is performed on the substrate support with the dummy substrate placed thereon, it is difficult for the cleaning process to remove the film deposited on the outer peripheral portion of the substrate contacting surface while in contact with a back surface of the dummy substrate. Therefore, there is a problem that particles may be generated.

SUMMARY

According to the present disclosure, there is provided a technique capable of cleaning a film deposited on an outer peripheral portion of a substrate placing surface.

Other objects and novel features of the technique of the present disclosure will become apparent from the descriptions of the present specification and the accompanying drawings.

The following is a brief overview of a representative one of the technique of the present disclosure.

That is, according to one aspect of the technique of the present disclosure, there is provided a substrate processing apparatus including: a process chamber in which a product substrate is processed; a substrate support provided in the process chamber and provided with a substrate placing surface on which the product substrate is placed; a process gas supplier through which a process gas is supplied into the process chamber while the product substrate being placed on the substrate placing surface; and a cleaning gas supplier through which a cleaning gas is supplied into the process chamber while a dummy substrate being placed on the substrate placing surface, wherein the dummy substrate is configured such that an outer peripheral portion of the dummy substrate is out of contact with the substrate placing surface in a state where the dummy substrate is placed on the substrate placing surface.

BRIEF DESCRIPTION OF THE DRAWINGS

FIG. 9 is a diagram schematically illustrating a substrate support structure according to the first embodiment of the present disclosure.

FIGS. 10A through 10D are diagrams schematically illustrating a gas supplier according to the first embodiment of the present disclosure, more specifically, FIG. 10A is a diagram schematically illustrating a first gas supplier, FIG. 10B is a diagram schematically illustrating a second gas supplier, FIG. 10C is a diagram schematically illustrating a purge gas supplier and FIG. 10D is a diagram schematically illustrating a third gas supplier.

FIG. 13 is a flow chart schematically illustrating a cleaning process according to the first embodiment of the present disclosure.

DETAILED DESCRIPTION

Embodiments

Figure 1:
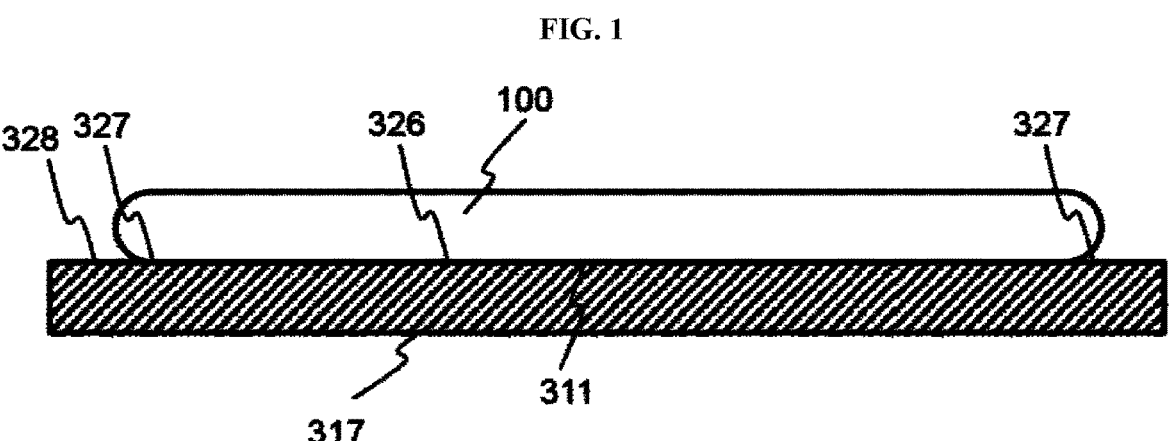
FIG. 1 is a diagram schematically illustrating a cross-section of a product substrate placed on a substrate support.

Hereinafter, one or more embodiments (also simply referred to as "embodiments") according to the technique of the present disclosure will be described with reference to the drawings. Like reference numerals represent like components in the drawings, and redundant descriptions related thereto will be omitted. In the drawings, for the sake of convenience of the descriptions, features may be schematically illustrated as compared with actual features. However, the drawings are merely examples of the embodiments, and the embodiments according to the technique of the present disclosure are not limited thereto.

First Embodiment

Figure 2:
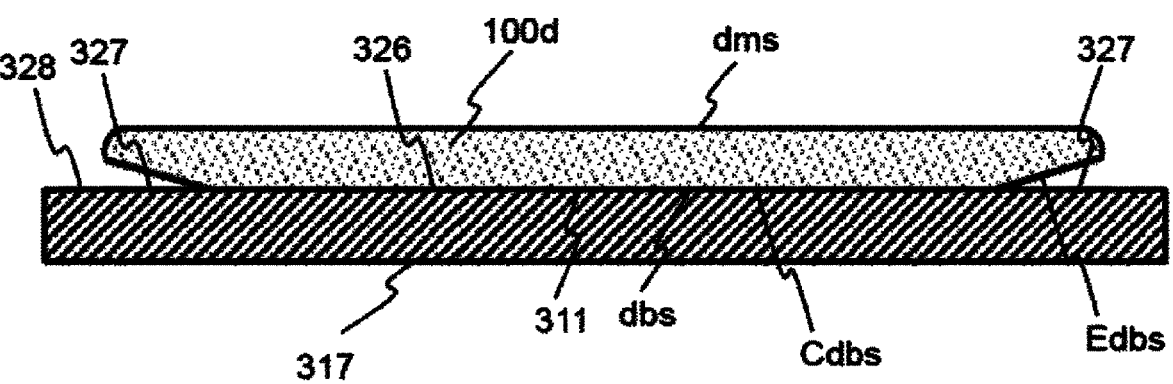
FIG. 2 is a diagram schematically illustrating a cross-section of a dummy substrate placed on the substrate support.
Figure 3:
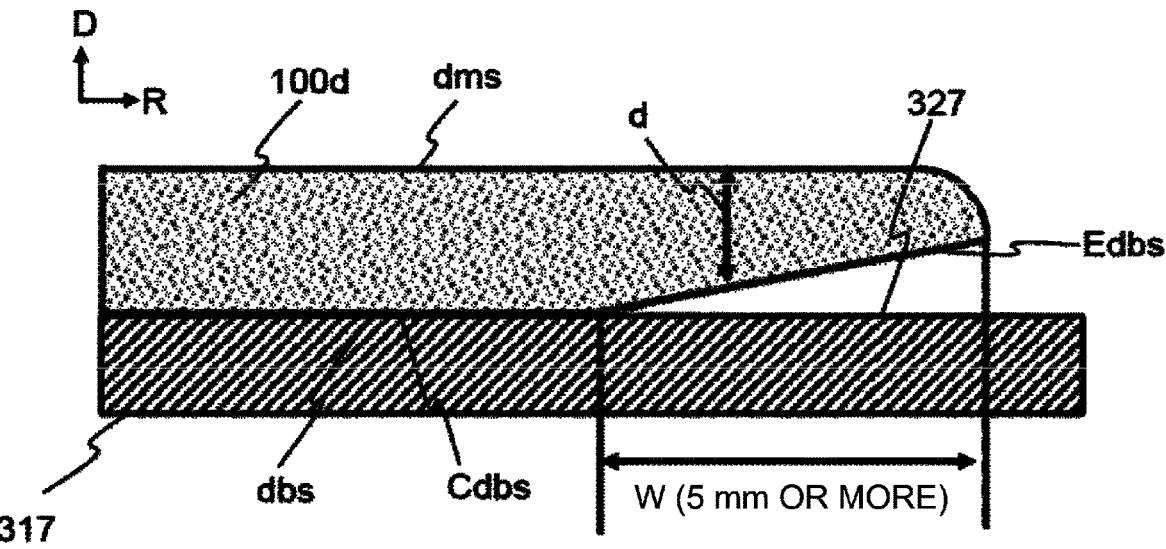
FIG. 3 is an enlarged view schematically illustrating an outer peripheral portion of the dummy substrate of FIG. 2.
Figures 4, 5:
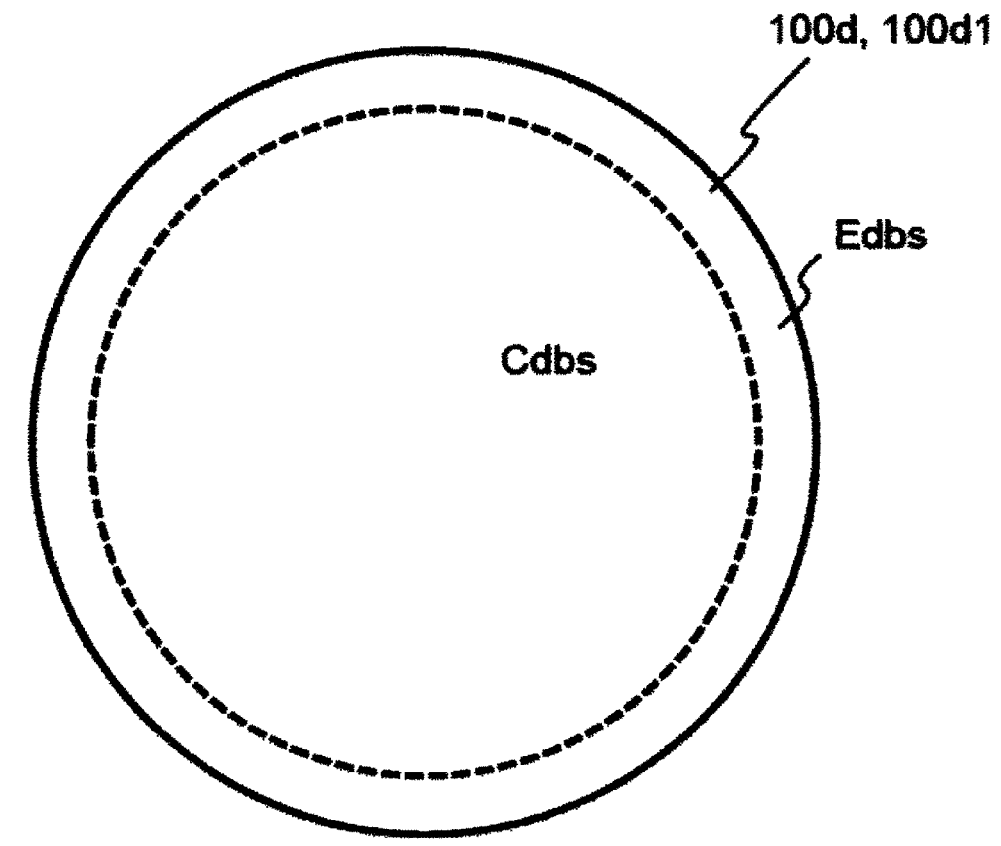
FIG. 4 is a diagram schematically illustrating a cross-section of a dummy substrate placed on the substrate support according to a first modified example.
FIG. 5 is a plan view schematically illustrating the dummy substrate of FIG. 2 or 4 when viewed from above.
Figure 6:
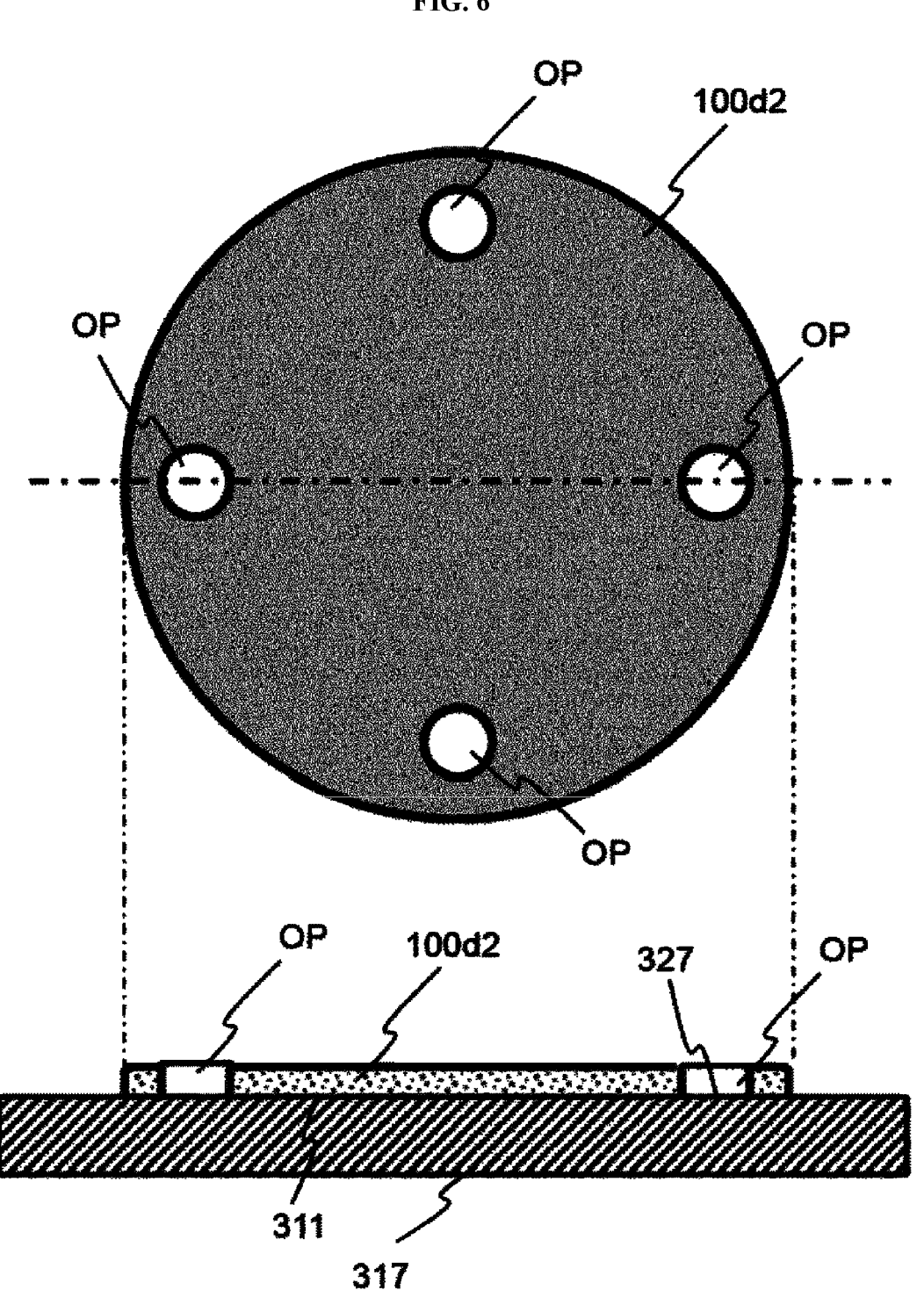
FIG. 6 is a plan view and a cross-sectional view schematically illustrating a dummy substrate according to a second modified example.

First, in order to clarify the present embodiment, a product substrate and a dummy substrate will be described with reference to FIGS. 1 through 6. FIG. 1 is a diagram schematically illustrating a cross-section of the product substrate placed on a substrate support. FIG. 2 is a diagram schematically illustrating a cross-section of a dummy substrate placed on the substrate support. FIG. 3 is an enlarged view schematically illustrating an outer peripheral portion of the dummy substrate of FIG. 2. FIG. 4 is a diagram schematically illustrating a cross-section of a dummy substrate placed on the substrate support according to a first modified example. FIG. 5 is a plan view schematically illustrating a cross-section of the dummy substrate of FIG. 2 or 4 when viewed from above. FIG. 6 is a plan view and a cross-sectional view schematically illustrating a dummy substrate according to a second modified example.

A substrate processing apparatus according to the present embodiment may include: a process chamber in which the product substrate is processed; the substrate support provided in a process chamber; a process gas supplier through which a process gas is supplied to the process chamber while the product substrate being placed on the substrate support; and a cleaning gas supplier through which a cleaning gas is supplied while the dummy substrate being placed on the substrate support. The dummy substrate is configured such that an outer circumference of the dummy substrate does not come into contact with the substrate support while the dummy substrate is supported by the substrate support. In the present specification, the term "process gas" may refer to a source gas, may refer to a reactive gas, or may refer to both of the source gas and the reactive gas. The term "cleaning gas" may refer to chlorine ($Cl_2$) gas, may refer to fluorine ($F_2$) gas, or may refer to both of the $Cl_2$ gas and the $F_2$ gas. However, another gas may be used as the cleaning gas. The cleaning gas is used for etching a deposited film.

FIG. 1 schematically illustrates a state in which the product substrate (also referred to as a "wafer") 100 is placed on a substrate placing surface 311 of the substrate support (also referred to as a "substrate placing plate") 317 in the process chamber. In such a state, when the process gas is supplied to the process chamber to perform a film-forming step on the wafer 100, the process gas is also supplied to an exposed surface (which is not in contact with the wafer 100 and also referred to as "a substrate non-contacting surface") 328 of the substrate placing surface 311. Therefore, the film is formed on the substrate non-contacting surface 328 as well as on the wafer 100 (that is, the film is deposited on the substrate non-contacting surface 328). On the other hand, since the process gas does not flow onto a back surface of the wafer 100 and a non-exposed surface (which is in contact with the wafer 100 and also referred to as "a substrate contacting surface") 326 of the substrate placing plate 317 is protected from the process gas, the film is not deposited on the substrate contacting surface 326. Therefore, when an entire upper surface (front surface) of the substrate placing plate 317 is uniformly cleaned, deposits are cleaned from the substrate non-contacting surface 328. However, an excessive cleaning may occur on the substrate contacting surface 326 of the substrate placing plate 317.

On the other hand, since the process gas is not completely prevented from reaching an outer peripheral portion 327 in the substrate contacting surface 326 of the substrate placing surface 311 in contact with the wafer 100 (that is, some of the process gas may flow onto the outer peripheral portion 327), the film is deposited along an entire circumference of the outer peripheral portion 327 in the substrate contacting surface 326. For example, in a cleaning process of the substrate placing plate 317, a normal dummy substrate of the same shape as the wafer 100 may be placed on the substrate placing surface 311, and the cleaning process may be performed on the substrate placing plate 317 with the dummy substrate placed thereon. However, when performing the cleaning process on the substrate placing plate 317 in a state where the dummy substrate is placed thereon, the process gas is less likely to reach the substrate placing surface 311 as in a case in which the wafer 100 is placed on the substrate placing plate 317. Therefore, it is difficult for the cleaning process to remove the film deposited on the substrate placing surface 311 in contact with the dummy substrate (that is, the film deposited along the entire circumference of the outer peripheral portion 327 in the substrate contacting surface 326). This is possibly because, for example, a shape of a side surface of the wafer 100 may not be exactly the same as a shape of a side surface of the dummy substrate due to an insufficient processing accuracy. Therefore, even when the cleaning process is performed on the substrate placing plate 317 with the normal dummy substrate placed thereon, the deposits may remain thereafter, and such deposits may be peeled off when, for example, the deposits come into contact with the wafer 100. As a result, particles may be generated.

Exemplary Configuration of Dummy Substrate

FIG. 2 schematically illustrates a state in which a dummy substrate 100d according to the present embodiment is placed on the substrate placing surface 311 of the substrate support (substrate placing plate) 317 in the process chamber. Unlike the product substrate, the dummy substrate 100d is a substrate on which an electronic component such as a transistor is not formed. For example, the dummy substrate 100d is made of a material such as silicon (Si), alumina, silicon oxide, silicon carbide and silicon nitride. As shown in FIG. 2, a shape of a front surface "dms" and a shape of a back surface "dbs" are different from each other in the dummy substrate 100d. That is, an outer peripheral portion of the dummy substrate 100d is configured such that a shape of the front surface dms of the outer peripheral portion is different from a shape of the back surface dbs of the outer peripheral portion.

The back surface dbs of the dummy substrate 100d is constituted by: an internal region "Cdbs" that is in contact with the substrate placing surface 311 while the dummy substrate being placed on the substrate support 317; and an external region "Edbs" that is not in contact with the substrate placing surface 311 of the substrate placing plate 317 while the dummy substrate being placed on the substrate support 317 and is connected to an outer peripheral portion of the internal region Cdbs so as to surround the internal region Cdbs. As shown in the enlarged view of FIG. 3, the external region Edbs is configured such that a thickness "d" in a vertical direction "D" of the dummy substrate 100d at a position in the external region Edbs becomes thinner as it moves away from a center of the dummy substrate 100d in a radial direction "R". For example, a width (also referred to as an "outer peripheral width") "W" of the external region Edbs may be set to 5 mm or more according to the present embodiment. As a result, it is possible to efficiently remove the film deposited on the outer peripheral portion 327 (of the substrate contacting surface 326) in the substrate placing surface 311 of the substrate placing plate 317. Further, in addition to the width (outer peripheral width) W of the external region Edbs being 5 mm or more, the thickness d of the external region Edbs decreases toward an outer periphery of the dummy substrate 100d. With the configuration of the dummy substrate 100d described above, it is possible to efficiently remove the film deposited on the outer peripheral portion 327 in a case where a thickness of the film deposited on the outer peripheral portion 327 of the substrate placing surface 311 varies along the direction R of the substrate placing surface 311. For example, the thickness of the film deposited on the outer peripheral portion 327 increases along the direction R of the substrate placing surface 311. In such a case, by using, for example, the dummy substrate 100d as shown in FIGS. 2 and 3, it is possible to decrease an amount of the cleaning gas supplied to a near-center region of the outer peripheral portion 327 relatively closer to a center of the substrate placing surface 311 while increasing an amount of the cleaning gas supplied to a near-periphery region of the outer peripheral portion 327 relatively closer to an outer periphery of the substrate placing surface 311. Herein, "the near-center region of the outer peripheral portion 327 is relatively closer to the center of the substrate placing surface 311" means that a distance between the near-center region and the center of the substrate placing surface 311 is shorter than a distance between the near-periphery region and the center of the substrate placing surface 311 in a state where the dummy substrate is placed on the substrate support 317. Further, "the near-periphery region of the outer peripheral portion 327 is relatively closer to the outer periphery of the substrate placing surface 311" means that a distance between the near-periphery region and the outer periphery of the substrate placing surface 311 is shorter than a distance between the near-center region and the outer periphery of the substrate placing surface 311 in a state where the dummy substrate is placed on the substrate support 317. The same or similar applies for the phrase "relatively closer to" in other paragraphs throughout the Specification.

When the cleaning gas is supplied to the dummy substrate 100d in the state shown in FIG. 2 to perform the cleaning process, the cleaning gas is introduced (supplied) to the substrate non-contacting surface 328 of the substrate placing surface 311, and a portion between a back surface of the external region Edbs of the back surface dbs of the dummy substrate 100d and a front surface of the outer peripheral portion 327 in the substrate contacting surface 326. Therefore, the film deposited and formed on the substrate non-contacting surface 328 in the film-forming step and the film deposited along the entire circumference of the outer peripheral portion 327 in the substrate contacting surface 326 of the substrate placing surface 311 in the film-forming step are removed by the cleaning gas.

Therefore, it is possible to prevent the substrate contacting surface 326 of the substrate placing surface 311, which is in contact with the internal region Cdbs of the back surface dbs of the dummy substrate 100d, from being exposed to the cleaning gas.

Further, by providing the external region Edbs, which is not in contact with the outer peripheral portion 327 in the substrate contacting surface 326, on the back surface dbs of the dummy substrate 100d, it is possible to efficiently clean (remove) the film thinly deposited on the outer peripheral portion 327 in the substrate contacting surface 326 of the substrate placing plate 317.

Since the wafer 100 is placed on the substrate placing plate 317 and processed, the film is not deposited at the substrate contacting surface 326 of the substrate placing plate 317. However, the film is deposited on the outer peripheral portion 327 in the substrate contacting surface 326 since a slight amount of the process gas is supplied to the outer peripheral portion 327. Therefore, a thickness of the film formed outside of the substrate contacting surface 326 (that is, formed on a substrate non-placing surface 325 shown in FIG. 7 and the substrate non-contacting surface 328) and a thickness of the outer peripheral portion 327 of the substrate contacting surface 326 are significantly greater than a thickness of the film formed at an inner area of the substrate contacting surface 326.

As a result, it is possible to prevent (or suppress) the excessive cleaning of the substrate contacting surface 326 of the substrate placing plate 317. Thereby, it is possible to extend a replacement period of the substrate placing plate 317. In addition, by removing the film deposited on the outer peripheral portion 327 in the substrate contacting surface 326, it is possible to prevent (or suppress) the particles from being generated due to peeling-off of the film deposited on the outer peripheral portion 327.

In a dummy substrate 100d1 according to a first modified example shown in FIG. 4, the thickness d of an external region Edbs in the vertical direction D at a position in the external region Edbs is set to a thickness d1 that is substantially constant regardless of a distance from a center of the dummy substrate 100d1 in the radial direction "R". Even when the cleaning process is performed using the dummy substrate 100d1, it is possible to obtain substantially the same effect as in the cleaning process using the dummy substrate 100d.

FIG. 5 schematically illustrates a plan view of the dummy substrate 100d or 100d1 when viewed from above (that is, when viewed from the front surface dms). As shown in FIG. 5, the external region Edbs of the dummy substrate 100d or 100d1 is provided along an entire region (entire circumference) of the outer periphery of the dummy substrate 100d or 100d1 of a circular shape so as to surround the internal region Cdbs of the dummy substrate 100d or 100d1.

In a dummy substrate 100d2 according to a second modified example shown in FIG. 6, through-holes OP are provided at four locations on an outer peripheral portion of the dummy substrate 100d2. Even when the cleaning process is performed using the dummy substrate 100d2, it is possible to obtain substantially the same effect as in the cleaning process using the dummy substrate 100*d*. In addition, 5 or more through-holes may be provided. The through-holes OP are open in the outer peripheral portion of the dummy substrate 100*d*2. Thereby, it is possible to introduce (supply) the cleaning gas from a front surface to a back surface of the dummy substrate 100*d*2. The cleaning gas supplied through the through-holes OP diffuses on the back surface of the dummy substrate 100*d*2 to remove the film thinly deposited on the outer peripheral portion 327 of the substrate placing surface 311. A shape of the outer peripheral portion of the dummy substrate 100*d*2 shown in FIG. 6 may be configured to be the same shape as the external region Edbs of the dummy substrate 100*d* or 100*d*1 of the present embodiment.

Exemplary Configuration of Substrate Processing Apparatus

Figure 7:
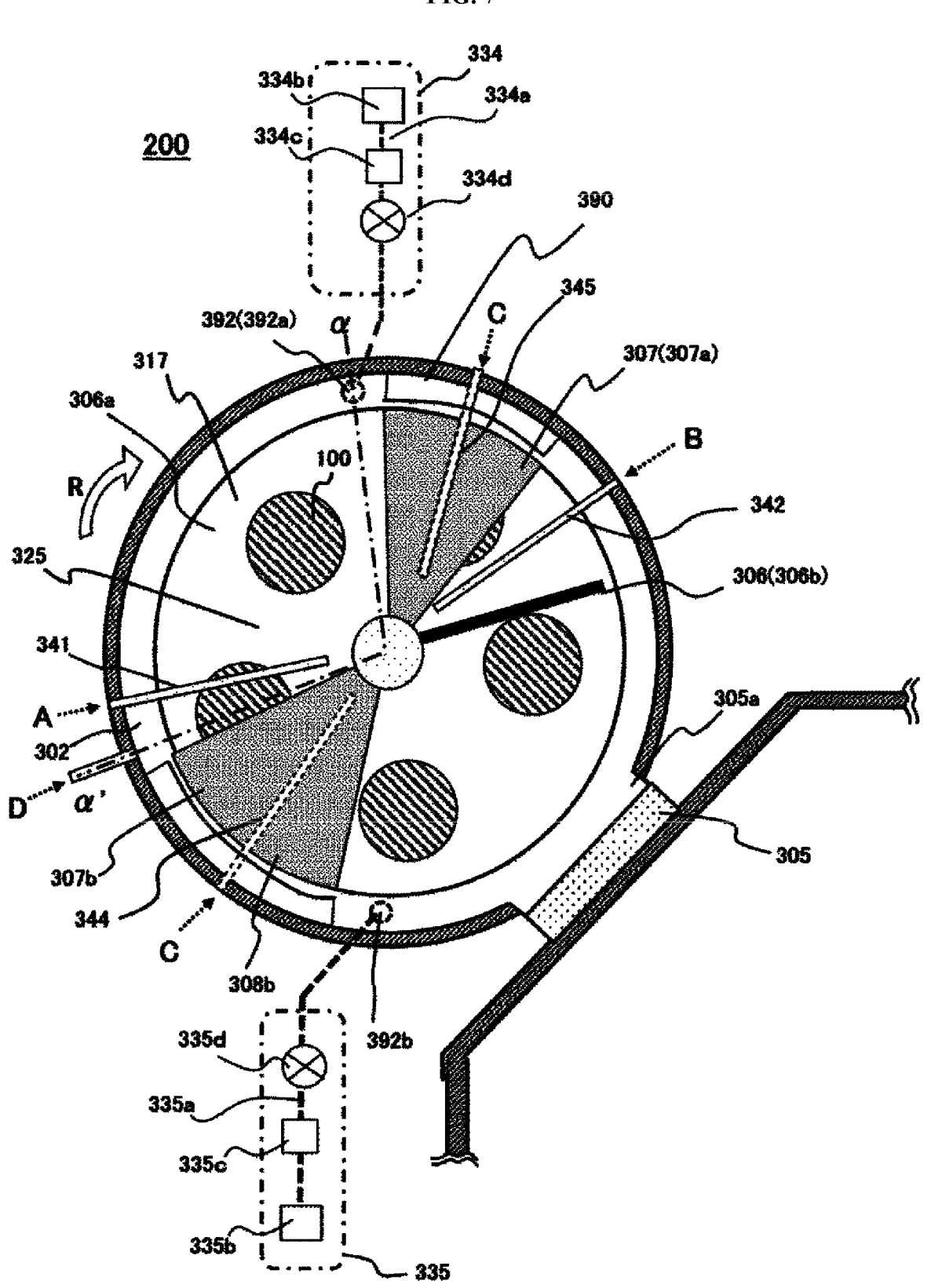
FIG. 7 is a diagram schematically illustrating a horizontal cross-section of a substrate processing apparatus according to a first embodiment of the present disclosure when viewed from above.
Figure 8:
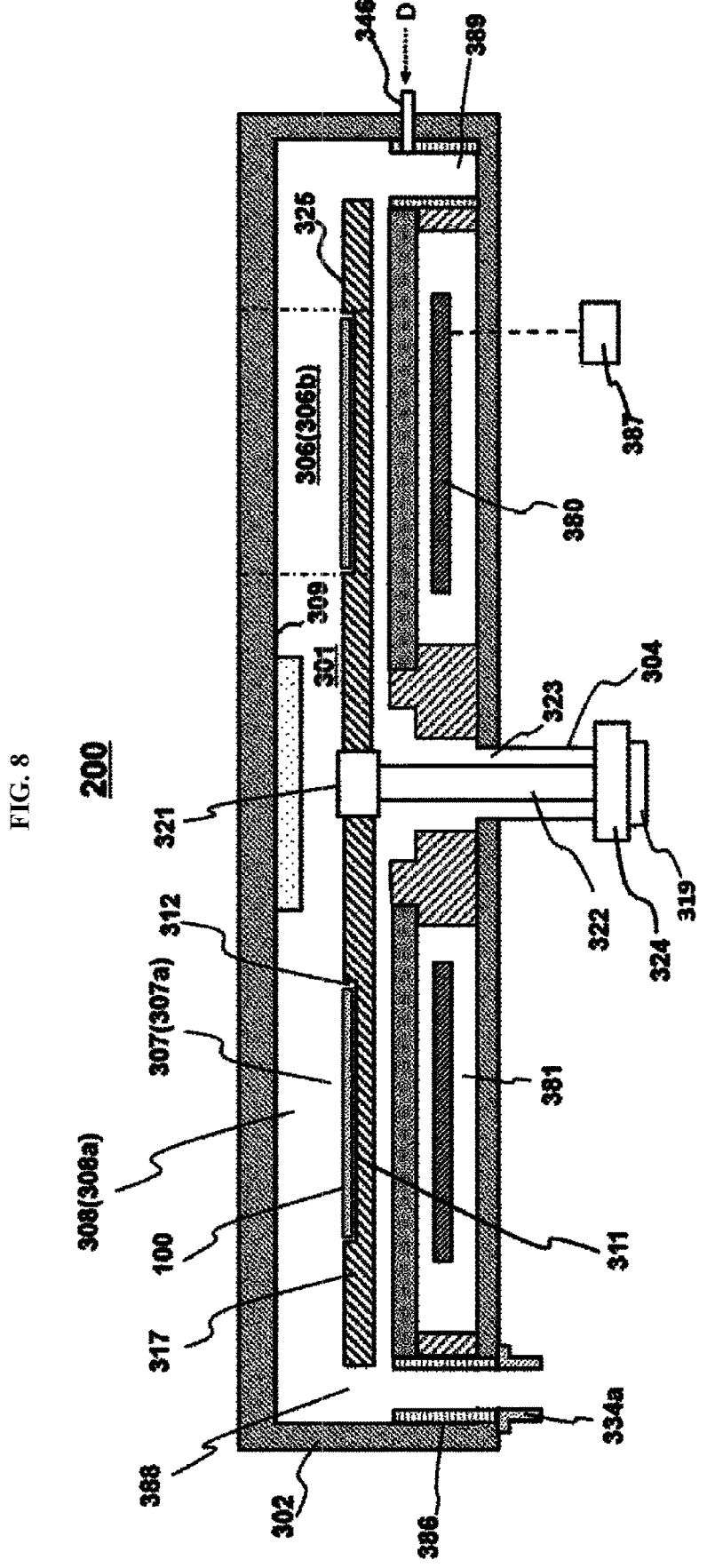
FIG. 8 is a diagram schematically illustrating a vertical cross-section of the substrate processing apparatus according to the first embodiment of the present disclosure.

Subsequently, a configuration of the substrate processing apparatus according to the present embodiment will be described mainly with reference to FIGS. 7, 8 and 9. FIG. 7 is a diagram schematically illustrating a horizontal cross-section of a substrate processing apparatus 200 according to the present embodiment when viewed from above. FIG. 8 is a diagram schematically illustrating a vertical cross-section of the substrate processing apparatus 200 according to the present embodiment. More specifically, FIG. 8 is a diagram schematically illustrating a cross-section of a chamber 302 shown in FIG. 7 taken along the line α-α' shown therein. The line α-α' is a line connecting from a to a' via a center of the chamber 302. FIG. 9 is a diagram schematically illustrating a substrate support structure according to the present embodiment.

A specific configuration of the substrate processing apparatus 200 will be described. The substrate processing apparatus 200 is controlled by a controller 400 described later.

As shown in FIGS. 7 and 8, the substrate processing apparatus 200 is constituted mainly by the chamber 302 which is a cylindrical sealed vessel (hermetic vessel). A process chamber 301 in which a plurality of substrates including a substrate (also referred to as the product substrate or the wafer) 100 are processed is provided in the chamber 302. Hereinafter, the plurality of substrates including the substrate 100 may also be simply referred to as "substrates 100" or "wafers 100". A gate valve 305 is connected to the chamber 302. The substrate 100 is loaded (transferred) into or unloaded (transferred) out of the chamber 302 through the gate valve 305. The gate valve 305 is provided adjacent to a passage 305*a*. The substrate 100 is moved through the passage 305*a*.

The process chamber 301 is constituted by a process region 306 (including a first process region 306*a* and a second process region 306*b*) to which the process gas such as a first gas and a second gas is supplied and a purge region 307 (including a first purge region 307*a* and a second purge region 307*b*) to which a purge gas is supplied. According to the present embodiment, the process region 306 and the purge region 307 are alternately arranged along a circumferential direction of the process chamber 301. For example, the first process region 306*a*, the first purge region 307*a*, the second process region 306*b* and the second purge region 307*b* are arranged along the circumferential direction in this order. As described later, for example, the first gas is supplied into the first process region 306*a*, the second gas is supplied into the second process region 306*b*, and an inert gas (purge gas) is supplied into the first purge region 307*a* and the second purge region 307*b*. As a result, a predetermined processing (substrate processing) is performed to the substrate 100 in accordance with the gas supplied into each region.

The first purge region 307*a* and the second purge region 307*b* are configured to spatially separate the first process region 306*a* and the second process region 306*b*. A ceiling 308 of each of the first purge region 307*a* and the second purge region 307*b* is disposed lower than a ceiling 309 of the process region 306. Specifically, a ceiling 308*a* is provided at the first purge region 307*a* and a ceiling 308*b* is provided at the second purge region 307*b*. By lowering each of the ceiling 308*a* and the ceiling 308*b*, it is possible to increase a pressure of a space in the first purge region 307*a* and a pressure of a space in the second purge region 307*b*. By supplying the purge gas to the spaces described above, it is possible to partition the adjacent process region 306 (that is, the first process region 306*a* and the second process region 306*b*). In addition, by supplying the purge gas, it is possible to remove excess gases (undesired gases) on the substrate 100.

The substrate placing plate 317 configured to be rotatable is provided at a center portion of the chamber 302. For example, a rotating shaft of the substrate placing plate 317 is provided at the center of the chamber 302. The substrate placing plate 317 is made of a material capable of allowing heat transmission, and is configured to transmit the heat radiated from a heater 380 described later. The substrate 100 is heated by the heat transmitted through the substrate placing plate 317.

The substrate placing plate 317 is configured such that the substrates 100 (for example, five substrates) can be arranged within the chamber 302 on the same plane and along the same circumference along a rotation direction "R" shown in FIG. 7.

As shown in FIGS. 7 and 8, a surface of the substrate placing plate 317 is constituted by a plurality of substrate placing surfaces including the substrate placing surface 311 and the substrate non-placing surface 325. Hereinafter, the plurality of substrate placing surfaces including the substrate placing surface 311 may also be simply referred to as substrate placing surface 311. The substrates 100 may be placed on the substrate placing surfaces 311, respectively. For example, the substrate placing surfaces 311 are arranged along a circle centered on the center of the substrate placing plate 317. That is, the substrate placing surfaces 311 are arranged at the same distance from the center of the substrate placing plate 317, and along the same circumference with equal intervals (for example, 72° intervals) therebetween. In FIG. 7, the illustration of the substrate placing surfaces 311 is omitted for simplification.

As shown in FIG. 8, the substrate placing surfaces 311 are provided on bottom surfaces of a plurality of concave structures including a concave structure 312, respectively. Hereinafter, the plurality of concave structures including the concave structure 312 may also be simply referred to as concave structures 312. For example, each of the concave structures 312 is of a circular shape when viewed from the upper surface of the substrate placing plate 317, and of a concave shape when viewed from a side surface of the substrate placing plate 317. It is preferable that a diameter of each of the concave structures 312 is slightly greater than a diameter of the substrate 100. For example, the substrate 100 may be placed on the substrate placing surface 311 by being placed on one of the concave structures 312.

A portion of the surface of the substrate placing plate 317 other than the substrate placing surface 311 is referred to as the substrate non-placing surface 325. The substrate non-placing surface 325 is a surface on which the substrate 100 is not placed. For example, substrate non-placing surface 325 refers to a surface between the concave structures 312, a surface on the center portion of the chamber 302 when viewed from the concave structures 312, and a surface on an outer peripheral portion of the chamber 302 when viewed from the concave structures 312.

A plurality of through-holes 317*a* penetrated by a plurality of pins 320 described later are provided at each of the concave structures 312. A substrate support structure 316 shown in FIG. 9 is provided in the chamber 302 at a location below the substrate placing plate 317 and facing the gate valve 305. The substrate support structure 316 includes the pins 320 configured to elevate or lower the substrate 100 and to support the back surface of the substrate 100 when the substrate 100 is loaded into or unloaded out of the process chamber 301. The pins 320 may be of an extendable configuration. For example, the pins 320 may be accommodated in a main body of the substrate support structure 316. When the substrate 100 is transferred, the pins 320 are extended such that the substrate 100 is supported by the pins 320. Thereafter, by moving front ends (tips) of the pins 320 downward, the substrate 100 is placed on one of the concave structures 312. The substrate support structure 316 may be embodied by any configuration as long as the pins 320 can be inserted into the through-holes 317*a* when the substrate 100 is placed.

The substrate placing plate 317 is fixed to a core portion 321. The core portion 321 is provided at the center of the substrate placing plate 317 and configured to fix the substrate placing plate 317. A shaft 322 is provided below the core portion 321. The shaft 322 supports the core portion 321.

A lower portion of the shaft 322 penetrates a hole 323 provided at a bottom of the chamber 302, and a bellows 304 provided outside the chamber 302 and capable of airtightly (hermetically) sealing the shaft 322 covers the lower portion of the shaft 322. In addition, a rotator (which is a rotating structure) 319 is provided at a lower end of the shaft 322. When the rotator 319 is also configured to elevate or lower the shaft 322, the rotator 319 may be referred to as an "elevator/rotator" which is an elevating and rotating structure. The rotator 319 is configured to rotate the substrate placing plate 317 in accordance with an instruction from the controller 400 described later.

A heater structure 381 is provided below the substrate placing plate 317. A plurality of heaters including the heater 380 serving as a heating device are embedded in the heater structure 381. Hereinafter, the plurality of heaters including the heater 380 may also be simply referred to as heaters 380. The heaters 380 are configured to heat the substrates 100 placed on the substrate placing plate 317, respectively. Each of the heaters 380 is arranged in the circumferential direction in accordance with a shape of the chamber 302. A heater temperature controller 387 is connected to the heaters 380. The heater temperature controller 387 is electrically connected to the controller 400 described later, and is configured to control a supply of the electric power to each of the heaters 380 in accordance with an instruction from controller 400 to perform a temperature control.

Figures 15A, 15B, 15C:
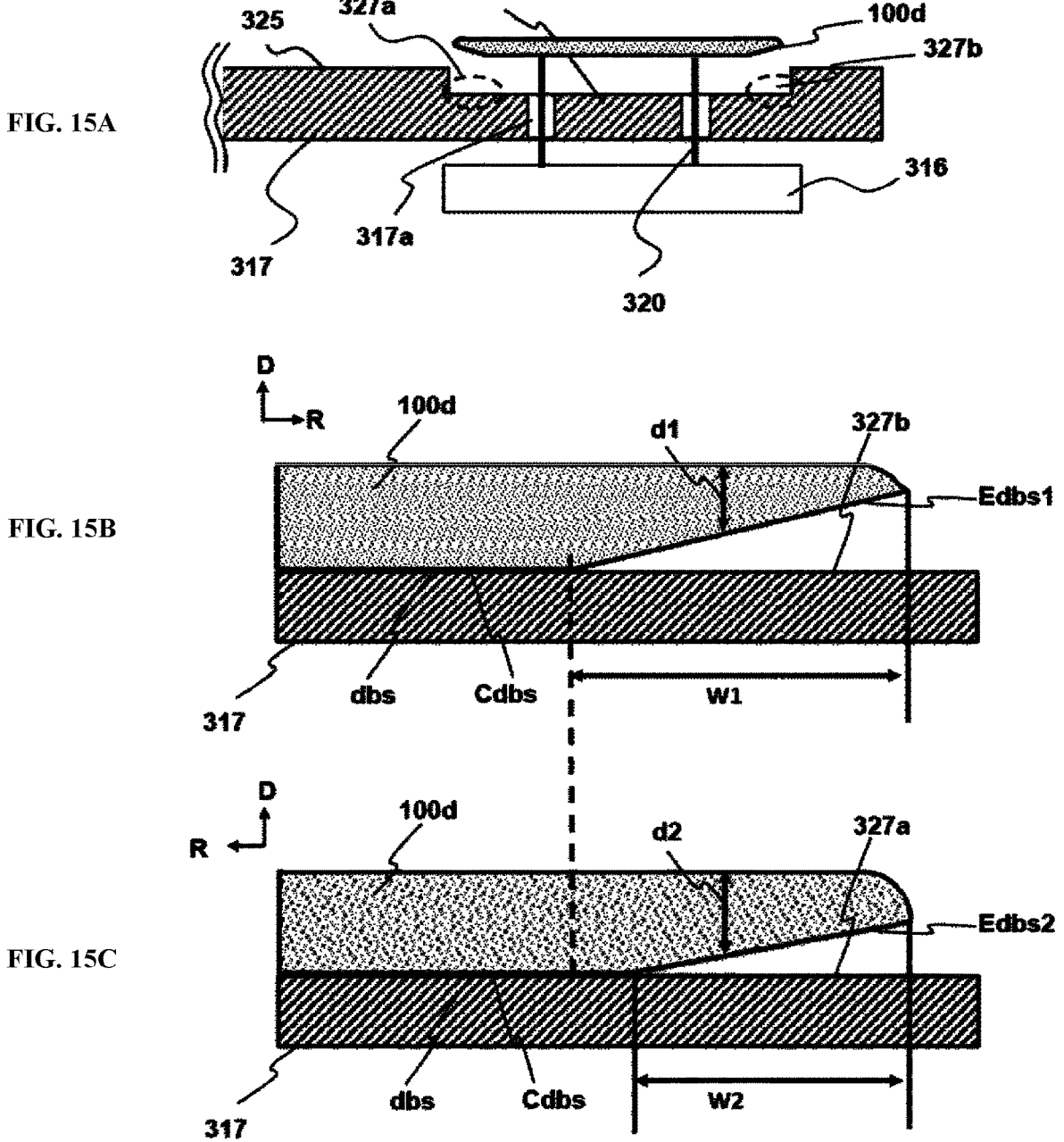
FIGS. 15A through 15C are diagrams schematically illustrating cross-sections of the dummy substrates placed on the substrate support, respectively.

An exhaust buffer structure 386 is disposed at an outer periphery of the substrate placing plate 317. The exhaust buffer structure 386 includes an exhaust groove 388 and an exhaust buffer space 389. Each of the exhaust groove 388 and the exhaust buffer space 389 is arranged in the circumferential direction in accordance with the shape of the chamber 302. In such a configuration, the thickness of the film deposited on the near-periphery region of the outer peripheral portion 327 of the substrate placing surface 311 relatively closer to the outer periphery of the substrate placing plate 317 may be thicker than the thickness of the film deposited on the near-center region of the outer peripheral portion 327 of the substrate placing surface 311 relatively closer to the center of the substrate placing plate 317. This is because, when the process gas described later flows from the center portion of the substrate placing plate 317 toward the outer periphery of the substrate placing plate 317, a concentration of the process gas may increase on the outer periphery (at which the exhaust buffer structure 386 is provided) of the substrate placing plate 317. Further, as shown in FIG. 9, when the substrate placing surface 311 is provided on the bottom surface of the concave structure 312, the thickness of the film deposited on the outer peripheral portion 327 of the substrate placing surface 311 may become thicker in the concave structure 312. Such a phenomenon becomes remarkable when the process gas stagnates between the concave structure 312 and the substrate 100. In addition, in the concave structure 312, the thickness of the film deposited on the outer peripheral portion 327 of the substrate placing surface 311 may vary along the radial direction of the substrate placing plate 317. For example, as shown in FIG. 15A, the thickness of the film deposited on the near-periphery region of an outer peripheral portion 327*b* of the substrate placing surface 311 relatively closer to the outer periphery (at which the exhaust buffer structure 386 is provided) of the substrate placing plate 317 may be thicker than the thickness of the film deposited on the near-center region of an outer peripheral portion 327*a* of the substrate placing surface 311 relatively closer to the center (at which the core portion 321 is located) of the substrate placing plate 317.

In the configuration described above, it is preferable that the shape of the near-center region of the external region Edbs of the dummy substrate 100*d* relatively closer to the center of the substrate placing plate 317 is different from the shape of the near-periphery region of the external region Edbs of the dummy substrate 100*d* relatively closer to the outer periphery of the substrate placing plate 317. With such a configuration, it is possible to uniformly clean both of the near-center region and the near-periphery region of the outer peripheral portion 327 of the substrate placing surface 311.

Further, it is preferable that the width (outer peripheral width) W of the near-center region of the external region Edbs of the dummy substrate 100*d* relatively closer to the center of the substrate placing plate 317 is different from the width (outer peripheral width) W of the near-periphery region of the external region Edbs of the dummy substrate 100*d* relatively closer to the outer periphery of the substrate placing plate 317. With such a configuration, it is possible to uniformly clean the near-center region and the near-periphery region of the outer peripheral portion 327 of the substrate placing surface 311. For example, as shown in FIGS. 15B and 15C, a width W1 of an edge Edbs1 of the dummy substrate 100*d* relatively closer to the outer periphery of the substrate placing plate 317 is configured to be greater than a width W2 of an edge Edbs2 of the dummy substrate 100*d* relatively closer to the center of the substrate placing plate 317 (that is, W1>W2).

Further, it is preferable that the thickness d of the external region Edbs of the dummy substrate 100*d* relatively closer to the center of the substrate placing plate 317 is different from the thickness d of the external region Edbs of the dummy substrate 100*d* relatively closer to the outer periphery of the substrate placing plate 317. With such a configuration, it is possible to uniformly clean the entire part of the outer peripheral portion 327 of the substrate placing surface 311. For example, as shown in FIGS. 15B and 15C, a thickness d1 of the edge Edbs1 of the dummy substrate 100*d* relatively closer to the outer periphery of the substrate placing plate 317 is configured to be smaller than a thickness d2 of the edge Edbs2 of the dummy substrate 100*d* relatively closer to the center of the substrate placing plate 317. Further, the edge Edbs1 of the dummy substrate 100*d* relatively closer to the outer periphery of the substrate placing plate 317 may be configured to be sharper than the edge Edbs2 of the dummy substrate 100*d* relatively closer to the center of the substrate placing plate 317. With such a configuration, it is possible to adjust the amount of the cleaning gas supplied to the near-periphery region of the outer peripheral portion 327*b* relatively closer to the outer periphery of the substrate placing plate 317 greater than the amount of the cleaning gas supplied to the near-center region of the outer peripheral portion 327*a* relatively closer to the center of the substrate placing plate 317. Thereby, it is possible to uniformly clean the outer peripheral portion 327*a* and the outer peripheral portion 327*b*.

A plurality of exhaust holes 392 are provided at a bottom of the exhaust buffer structure 386. Gases supplied into the process chamber 301 are exhausted through the plurality of exhaust holes 392. Each of the gases is exhausted through the plurality of exhaust holes 392 via the exhaust groove 388 and the exhaust buffer space 389.

A convex structure 390 is provided at a location of the exhaust buffer structure 386 adjacent to the purge region 307. The convex structure 390 is of an extendable structure extending from an outer periphery of the exhaust buffer structure 386 toward the substrate placing plate 317.

By providing the convex structure 390, it is possible to prevent a large amount of an inert gas (purge gas) supplied through the purge region 307 from flowing into the exhaust buffer structure 386. Thereby, it is possible to reliably block the gas flowing from an upstream side in a gas flow direction.

Figures 10C, 10D:
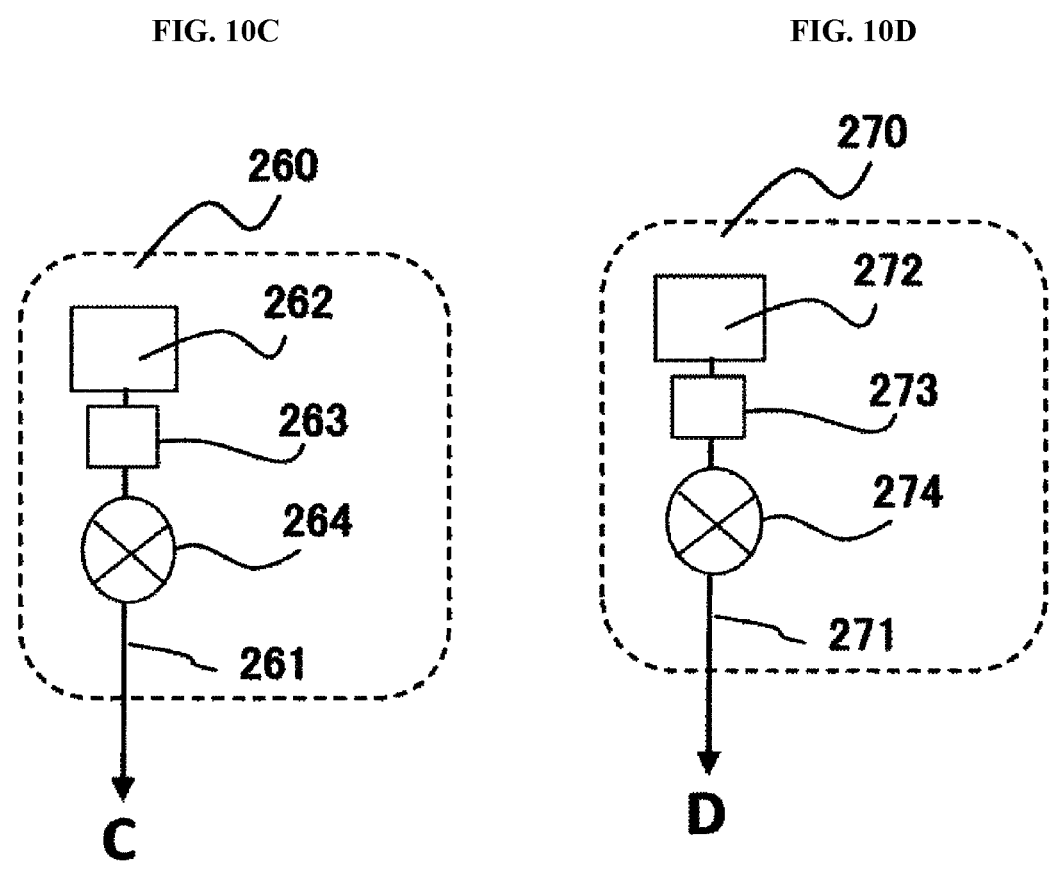

Subsequently, a gas supplier (which is a gas supply structure or a gas supply system) will be described with reference to FIGS. 10A through 10D. FIG. 10A is a diagram schematically illustrating a first gas supplier (which is a first gas supply structure or a first gas supply system) 240 which is a part of the gas supplier. FIG. 10B is a diagram schematically illustrating a second gas supplier (which is a second gas supply structure or a second gas supply system) 250 which is a part of the gas supplier. FIG. 10C is a diagram schematically illustrating a purge gas supplier (which is a purge gas supply structure or a purge d gas supply system) 260 which is a part of the gas supplier. FIG. 10D is a diagram schematically illustrating a third gas supplier (which is a third gas supply structure or a third gas supply system) 270 which is a part of the gas supplier.

A nozzle 341, a nozzle 342, a nozzle 344, a nozzle 345 and a nozzle 346 are provided at the chamber 302. A location indicated by a reference character "A" shown in FIG. 7 is connected to a location indicated by a reference character "A" shown in FIG. 10A. That is, the nozzle 341 is connected to a first gas supply pipe 241. A location indicated by a reference character "B" shown in FIG. 7 is connected to a location indicated by a reference character "B" shown in FIG. 10B. That is, the nozzle 342 is connected to a second gas supply pipe 251. A location indicated by a reference character "C" shown in FIG. 7 is connected to a location indicated by a reference character "C" shown in FIG. 10C. That is, each of the nozzle 344 and the nozzle 345 is connected to a purge gas supply pipe 261. A location indicated by a reference character "D" shown in FIG. 8 is connected to a location indicated by a reference character "D" shown in FIG. 10D. That is, the nozzle 346 is connected to a third gas supply pipe 271.

The first gas supplier 240 (which is a part of the gas supplier) will be described with reference to FIG. 10A. The first gas is mainly supplied through the first gas supply pipe 241.

A first gas supply source 242, a mass flow controller (MFC) 243 serving as a flow rate controller (which is a flow rate control structure) and a valve 244 serving as an opening/closing valve are sequentially provided at the first gas supply pipe 241 in this order from an upstream side to a downstream side of the first gas supply pipe 241 in the gas flow direction.

A gas containing a first element (hereinafter, also simply referred to as the "first gas") is supplied to the nozzle 341 through the first gas supply pipe 241 provided with the MFC 243 and the valve 244.

The first gas refers to a source gas which is one of process gases. According to the present embodiment, for example, the first element is silicon (Si). That is, the first gas is a silicon gas (also referred to as a silicon-containing gas) which is a gas containing silicon as a main component. Specifically, dichlorosilane ($SiH_2Cl_2$, abbreviated as DCS) gas may be used as the silicon-containing gas.

The first gas supplier 240 is constituted mainly by the first gas supply pipe 241, the MFC 243, the valve 244 and the nozzle 341. The first gas supplier 240 may further include the first gas supply source 242. The first gas supplier 240 may also be referred to as a "first process gas supplier 240" which is a first process gas supply structure or a first process gas supply system.

Subsequently, the second gas supplier 250 (which is a part of the gas supplier) will be described with reference to FIG. 10B. A second gas supply source 252, a mass flow controller (MFC) 253 serving as a flow rate controller and a valve 254 serving as an opening/closing valve are sequentially provided at the second gas supply pipe 251 in this order from an upstream side to a downstream side of the second gas supply pipe 251 in the gas flow direction.

The second gas reacting with the first gas is supplied to the nozzle 342 through the second gas supply pipe 251. The second gas refers to a reactive gas which is one of the process gases. For example, the second gas is a nitrogen-containing gas which is a gas containing nitrogen (N) as a main component. For example, ammonia ($NH_3$) gas may be used as the nitrogen-containing gas.

The second gas supplier 250 is constituted mainly by the second gas supply pipe 251, the MFC 253, the valve 254 and the nozzle 342. Since the second gas supplier 250 is configured to supply the reactive gas, the second gas supplier 250 may also be referred to as a "reactive gas supplier" 250 which is a reactive gas supply structure or a reactive gas supply system. The second gas supplier 250 may further include the second gas supply source 252. The second gas supplier 250 may also be referred to as a "second process gas supplier 250" which is a second process gas supply structure or a second process gas supply system.

Subsequently, the purge gas supplier 260 (which is a part of the gas supplier) will be described with reference to FIG. 10C. A purge gas supply source 262, a mass flow controller (MFC) 263 serving as a flow rate controller and a valve 264 serving as an opening/closing valve are sequentially provided at the purge gas supply pipe 261 in this order from an upstream side to a downstream side of the purge gas supply pipe 261 in the gas flow direction.

The purge gas is supplied to the nozzle 344 and the nozzle 345 through the purge gas supply pipe 261. The purge gas refers to a gas that does not react with the first gas and the second gas. An inner atmosphere of the process chamber 301 can be purged by the purge gas. For example, nitrogen ($N_2$) gas may be used as the purge gas.

The purge gas supplier 260 is constituted mainly by the purge gas supply pipe 261, the MFC 263, the valve 264, the nozzle 344 and the nozzle 345. The purge gas supplier 260 may further include the purge gas supply source 262.

The first gas supplier 240 and the second gas supplier 250 may also be collectively or individually referred to as the process gas supplier which is a process gas supply structure or a process gas supply system. The process gas supplier may further include the purge gas supplier 260.

Subsequently, the third gas supplier 270 (which is a part of the gas supplier) will be described with reference to FIG. 10D. A third gas supply source 272, a mass flow controller (MFC) 273 serving as a flow rate controller and a valve 274 serving as an opening/closing valve are sequentially provided at the third gas supply pipe 271 in this order from an upstream side to a downstream side of the third gas supply pipe 271 in the gas flow direction.

The cleaning gas is supplied through the third gas supply pipe 271 so as to remove the film formed on the substrate placing plate 317. For example, as the cleaning gas, a gas such as the chlorine ($Cl_2$) gas, the fluorine ($F_2$) gas and a mixed gas of the chlorine ($Cl_2$) gas and the fluorine ($F_2$) gas may be used.

The third gas supplier 270 is constituted mainly by the third gas supply pipe 271, the MFC 273, the valve 274 and the nozzle 346. Since the third gas supplier 270 is configured to supply the cleaning gas, the third gas supplier 270 may also be referred to as the "cleaning gas supplier" 270 which is a cleaning gas supply structure or a cleaning gas supply system. The third gas supplier 270 may further include the third gas supply source 272.

Subsequently, an exhauster (which is an exhaust structure) will be described. As described above, the plurality of exhaust holes 392 are provided at a lower portion of the chamber 302. The plurality of exhaust holes 392 are provided for the first purge region 307a and the second purge region 307b, respectively. For example, an exhaust hole 392a is provided at a location corresponding to the first purge region 307a, and an exhaust hole 392b is provided at a location corresponding to the second purge region 307b.

An exhaust pipe 334a which is a part of a first exhauster (which is a first exhaust structure) 334 is provided so as to communicate with the exhaust hole 392a. A vacuum pump 334b serving as a vacuum exhaust apparatus is connected to the exhaust pipe 334a via a valve 334d serving as an opening/closing valve and an APC (Automatic Pressure Controller) valve 334c serving as a pressure regulator (which is a pressure adjusting structure). The vacuum pump 334b is configured to vacuum-exhaust the inner atmosphere of the process chamber 301 such that an inner pressure of the process chamber 301 reaches and is maintained at a predetermined pressure (vacuum degree). The exhaust pipe 334a, the valve 334d and the APC valve 334c may also be collectively referred to as the first exhauster 334. The first exhauster 334 may further include the vacuum pump 334b.

Similar to the first exhauster 334, a second exhauster (which is a second exhaust structure) 335 is connected to the exhaust hole 392b. An exhaust pipe 335a, a valve 335d and an APC valve 335c may also be collectively referred to as the second exhauster 335. The second exhauster 335 may further include a vacuum pump 335b. In addition, the first exhauster 334 and the second exhauster 335 may also be collectively referred to as the exhauster.

Exemplary Configuration of Controller

Figure 11:
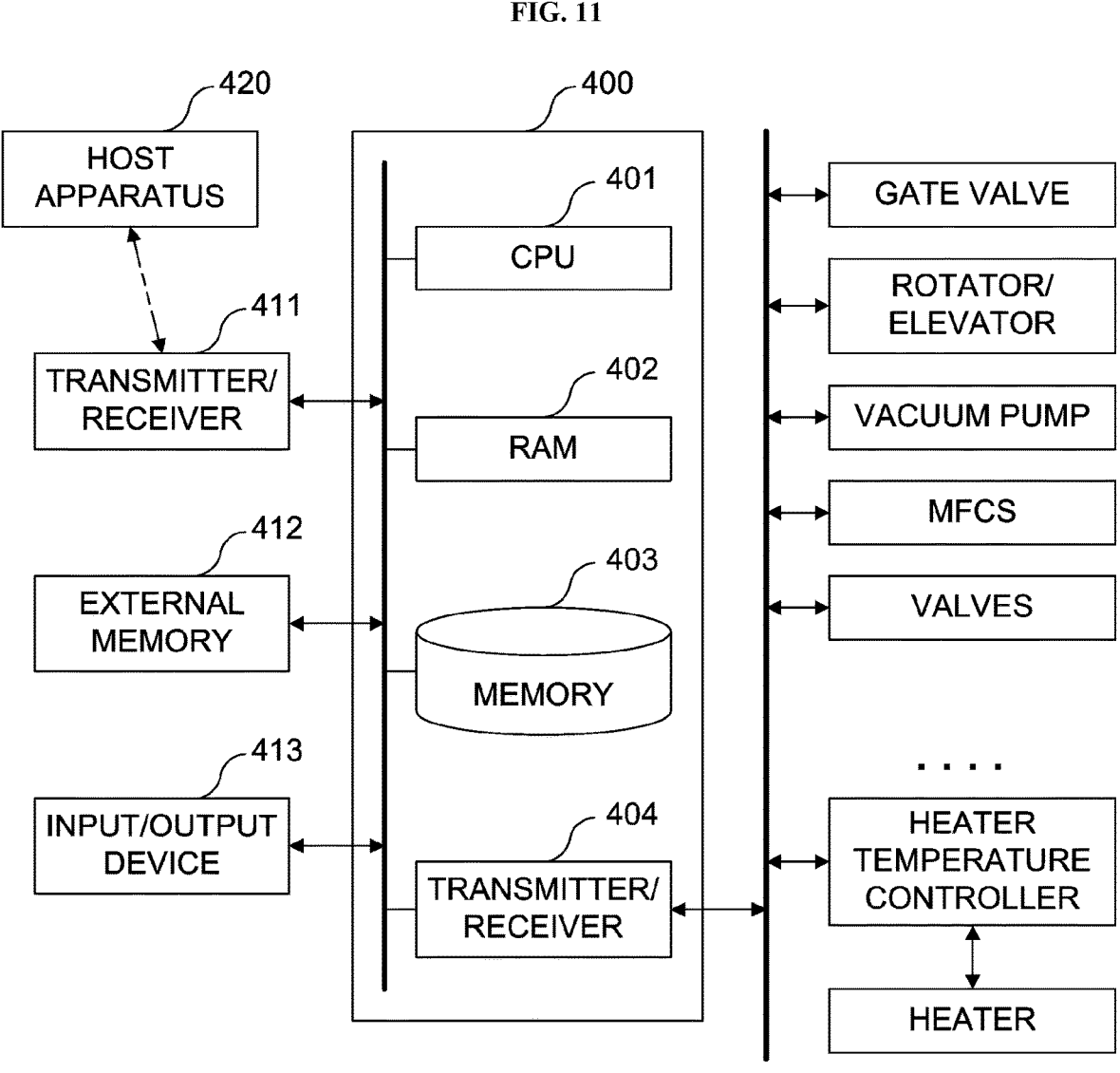
FIG. 11 is a block diagram schematically illustrating an exemplary configuration of a controller and related components of the substrate processing apparatus according to the first embodiment of the present disclosure.

Subsequently, the controller 400 will be described with reference to FIG. 11. FIG. 11 is a diagram schematically illustrating an exemplary configuration of the controller 400 and related components of the substrate processing apparatus 200.

The substrate processing apparatus 200 includes the controller 400 configured to control operations of components of the substrate processing apparatus 200 such as the gas supplier, the elevator/rotator, the valves described above and the MFCs described above. The controller 400 includes at least a CPU (Central Processing Unit) 401 serving as an arithmetic processor, a RAM (Random Access Memory) 402 serving as a temporary memory, a memory 403 and a transmitter/receiver 404. The controller 400 is connected to the components of the substrate processing apparatus 200 via the transmitter/receiver 404, calls a program or a recipe from the memory 403 in accordance with an instruction from a host controller or a user, and controls the operations of the components of the substrate processing apparatus 200 according to the contents of the instruction. The controller 400 may be embodied by a dedicated computer or by a general-purpose computer. According to the present embodiment, for example, the controller 400 may be embodied by preparing an external memory 412 storing the program and by installing the program onto the general-purpose computer using the external memory 412. For example, the external memory 412 may include a magnetic tape, a magnetic disk such as a flexible disk and a hard disk, an optical disk such as a CD and a DVD, a magneto-optical disk such as an MO and a semiconductor memory such as a USB memory (USB flash drive) and a memory card. A method of providing the program to the computer is not limited to the external memory 412. For example, the program may be supplied to the computer (general-purpose computer) using communication means such as the Internet and a dedicated line. The program may also be provided to the computer without using the external memory 412 by receiving information (that is, the program) from a host apparatus 420 via a transmitter/receiver 411. In addition, a user can input an instruction to the controller 400 using an input/output device 413 such as a keyboard and a touch panel.

The memory 403 or the external memory 412 may be embodied by a non-transitory computer readable recording medium. Hereafter, the memory 403 and the external memory 412 may be collectively or individually referred to as a "recording medium". In the present specification, the term "recording medium" may refer to the memory 403 alone, may refer to the external memory 412 alone, or may refer to both of the memory 403 and the external memory 412.

Substrate Processing

Figure 12:
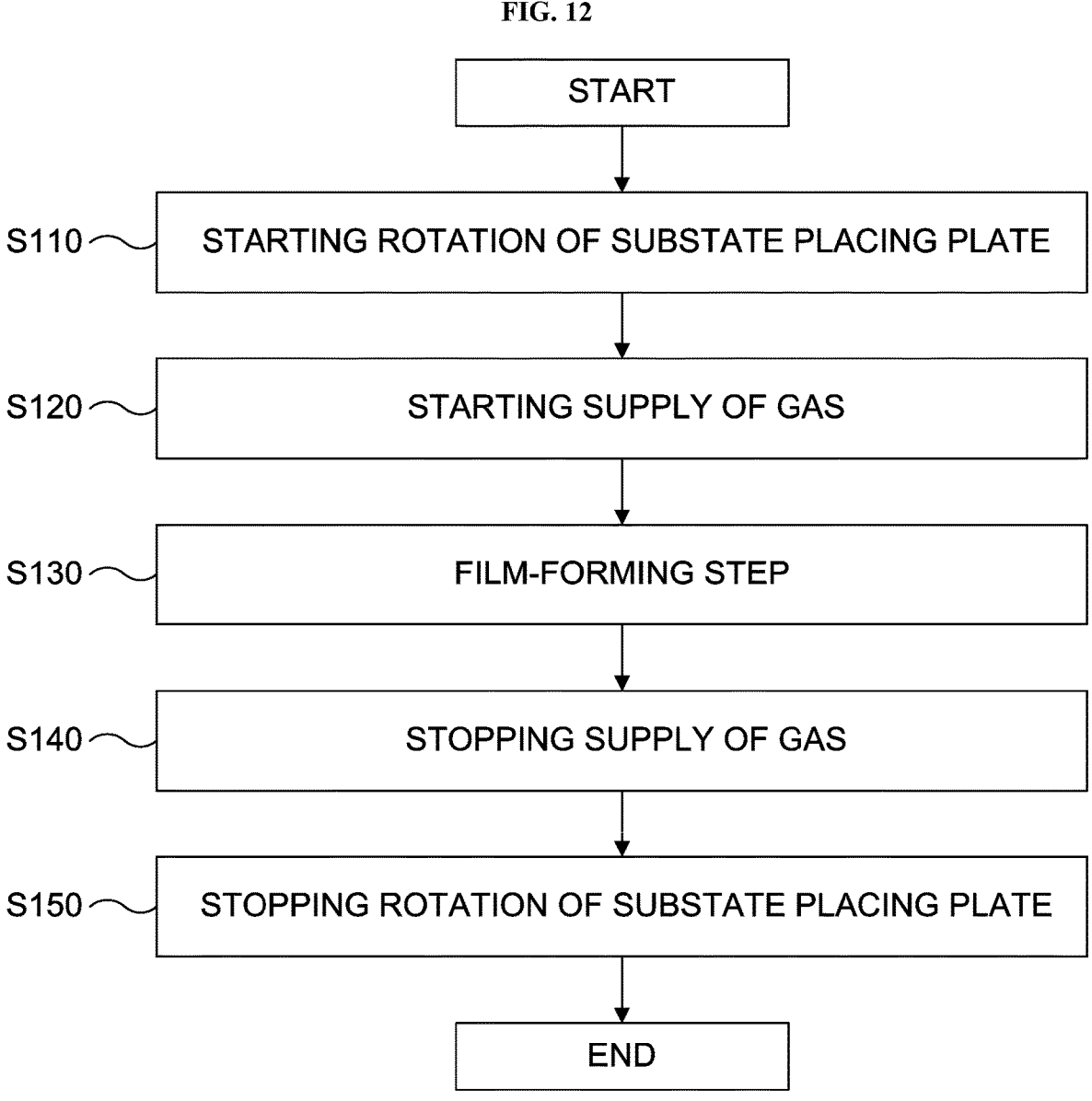
FIG. 12 is a flow chart schematically illustrating a substrate processing according to the first embodiment of the present disclosure.

Subsequently, a substrate processing such as a film-forming process according to the present embodiment will be described with reference to FIG. 12. FIG. 12 is a flow chart schematically illustrating the substrate processing according to the present embodiment. In the following description, the operations of the components constituting the substrate processing apparatus 200 are controlled by the controller 400.

Hereinafter, the substrate processing according to the present embodiment will be described by way of an example in which a silicon nitride film (also simply referred to as an "SiN film") is formed as the film on the substrate 100 by using the silicon-containing gas as the first gas and the ammonia gas as the second gas.

A substrate loading and placing step will be described. In FIG. 12, the illustration of the substrate loading and placing step is omitted. The concave structure 312 is moved to a position adjacent to the gate valve 305 by rotating the substrate placing plate 317. Then, the pins 320 are elevated such that the pins 320 pass through the through-holes 317a of the substrate placing plate 317. Subsequently, the gate valve 305 is opened so as to communicate the chamber 302 with a vacuum transfer chamber (not shown). Then, the substrate 100 is placed on the pins 320 from the vacuum transfer chamber by using a wafer transfer device (not shown). After the substrate 100 is placed on the pins 320, by lowering the pins 320, the substrate 100 is placed on one of the substrate placing surfaces 311.

After the substrate 100 is placed on one of the substrate placing surfaces 311, the substrate placing plate 317 is rotated until another one of the substrate placing surfaces 311, where the substrate 100 is not placed, faces the gate valve 305. Thereafter, still another one of the substrates 100 is placed on the above-mentioned another one of the substrate placing surfaces 311. An operation described above is repeatedly performed until the substrates 100 are placed on an entirety of the substrate placing surfaces 311.

When the substrate 100 is placed on the substrate placing plate 317, the electric power is supplied to the heater 380 in advance such that a temperature (surface temperature) of the substrate 100 is adjusted to a predetermined temperature. For example, the predetermined temperature of the substrate 100 according to the present embodiment may be set to a temperature within a range from 400° C. to 500° C. The heat radiated from the heater 380 is applied to the back surface of the substrate 100 via the substrate placing plate 317. It is preferable that the electric power is continuously supplied to the heater 380 from the substrate loading and placing step until at least a substrate unloading step described later is completed.

A step S110 of starting the rotation of the substrate placing plate 317 will be described. After the substrates 100 are placed on an entirety of the concave structures 312, the controller 400 controls the rotator 319 to rotate the substrate placing plate 317 in the "R" direction shown in FIG. 7. By rotating the substrate placing plate 317, the substrate 100 is moved to the first process region 306a, the first purge region 307a, the second process region 306b and the second purge region 307b sequentially in this order.

A step S120 of starting a supply of the gas will be described. When the substrate 100 is heated to a desired temperature and a rotation speed of the substrate placing plate 317 reaches and is maintained at a desired rotation speed, the valve 244 is opened to start a supply of the silicon-containing gas into the first process region 306a. In parallel with the supply of the silicon-containing gas, the valve 254 is opened to start a supply of the NH₃ gas into the second process region 306b.

In the step S120, a flow rate of the silicon-containing gas is adjusted by the MFC 243 to a predetermined flow rate. For example, the predetermined flow rate of the silicon-containing gas in the step S120 may be set to a flow rate within a range from 50 sccm to 500 sccm.

In the step S120, a flow rate of the NH₃ gas is adjusted by the MFC 253 to a predetermined flow rate. For example, the predetermined flow rate of the NH₃ gas in the step S120 may be set to a flow rate within a range from 100 sccm to 5,000 sccm.

In addition, after the substrate loading and placing step, the process chamber 301 is exhausted by the first exhauster 334 and the second exhauster 335, and the N₂ gas serving as the purge gas is supplied into the first purge region 307a and the second purge region 307b through the purge gas supplier 260.

The film-forming step S130 will be described. In the film-forming step S130, a silicon-containing layer is formed on the substrate 100 in the first process region 306a. After the substrate 100 is rotated to the second process region 306b, by reacting the silicon-containing layer with the NH₃ gas in the second process region 306b, the silicon nitride film (SiN film) is formed on the substrate 100. The substrate placing plate 317 is rotated a predetermined number of times such that the SiN film of a desired thickness is obtained. When forming the SiN film of the desired thickness, since the gas such as the silicon-containing gas and the NH₃ gas is also supplied to the substrate non-placing surface 325, the film (SiN film) is also formed on the substrate non-placing surface 325.

A step S140 of stopping the supply of the gas will be described. After the substrate placing plate 317 is rotated the predetermined number of times, the valve 244 is closed to stop the supply of the silicon-containing gas to the first process region 306a and the valve 254 is closed to stop the supply of the NH₃ gas to the second process region 306b.

A step S150 of stopping the rotation of the substrate placing plate 317 will be described. After the supply of the silicon-containing gas and the supply of the NH₃ gas are stopped according to the step S140, the rotation of the substrate placing plate 317 is stopped in the step S150.

The substrate unloading step will be described. In FIG. 12, the illustration of the substrate unloading step is omitted. The substrate placing plate 317 is rotated to move the substrate 100 to be unloaded to the position adjacent to the gate valve 305. Thereafter, the substrate 100 to be unloaded is transferred (unloaded) out of the chamber 302 in a manner reverse to that of the substrate loading and placing step. An operation described above is repeatedly performed until an entirety of the substrates 100 are unloaded out of the chamber 302.

Cleaning Process

Subsequently, the cleaning process according to the present embodiment will be described with reference to FIG. 13. FIG. 13 is a flow chart schematically illustrating the cleaning process according to the present embodiment. In the following description, the operations of the components constituting the substrate processing apparatus 200 are controlled by the controller 400.

The cleaning process is performed after processing a predetermined number of substrates by the substrate processing shown in FIG. 12. That is, after the film-forming process (that is, the substrate processing shown in FIG. 12) is performed on a certain number (which is determined by a parameter such as an accumulative value of the thickness of the film (also referred to as an "accumulative thickness value of the film")) of semiconductor substrates (wafers) by the substrate processing apparatus 200, the cleaning process is performed with respect to the substrate processing apparatus 200. After the cleaning process is completed, the substrate processing shown in FIG. 12 may be performed again.

As the cleaning gas, for example, a gas containing chlorine (Cl), fluorine (F) or both of chlorine and fluorine may be used. The film deposited on the substrate placing plate 317 is etched by the cleaning gas. The present embodiment will be described by way of an example in which the dummy substrate 100d described with reference to FIG. 2 is used as the dummy substrate. However, the dummy substrate 100*d*1 or 100*d*2 described with reference to FIG. 4 or 6 may be used as the dummy substrate.

A dummy substrate loading and placing step will be described. In FIG. 13, the illustration of the dummy substrate loading and placing step is omitted. The concave structure 312 is moved to the position adjacent to the gate valve 305 by rotating the substrate placing plate 317. Then, the pins 320 are elevated such that the pins 320 pass through the through-holes 317*a* of the substrate placing plate 317. Subsequently, the gate valve 305 is opened so as to communicate the chamber 302 with the vacuum transfer chamber (not shown). Then, the dummy substrate 100*d* is placed on the pins 320 from the vacuum transfer chamber by using the wafer transfer device (not shown). After the dummy substrate 100*d* is placed on the pins 320, by lowering the pins 320, the dummy substrate 100*d* is placed on one of the substrate placing surfaces 311.

After the dummy substrate 100*d* is placed on one of the substrate placing surfaces 311, the substrate placing plate 317 is rotated until another one of the substrate placing surfaces 311, where the dummy substrate 100*d* is not placed, faces the gate valve 305. Thereafter, still another one of a plurality of dummy substrates is placed on the above-mentioned another one of the substrate placing surfaces 311. An operation described above is repeatedly performed until an entirety of the plurality of dummy substrates including the dummy substrate 100*d* are placed on the entirety of the substrate placing surfaces 311. Hereinafter, the plurality of dummy substrates including the dummy substrate 100*d* may also be simply referred to as "dummy substrates 100*d*".

When the dummy substrate 100*d* is placed on the substrate placing plate 317, the electric power is supplied to the heater 380 in advance such that a temperature (surface temperature) of the dummy substrate 100*d* is adjusted to a predetermined temperature. For example, the predetermined temperature of the dummy substrate 100*d* according to the present embodiment may be set to a temperature within a range from 400° C. to 500° C. The heat radiated from the heater 380 is applied to a back surface of the dummy substrate 100*d* via the substrate placing plate 317. It is preferable that the electric power is continuously supplied to the heater 380 from the dummy substrate loading and placing step until at least a dummy substrate unloading step described later is completed.

A step S210 of starting the rotation of the substrate placing plate 317 will be described. After the dummy substrates 100*d* are placed on the entirety of the concave structures 312, the controller 400 controls the rotator 319 to rotate the substrate placing plate 317 in the "R" direction shown in FIG. 7. By rotating the substrate placing plate 317, the dummy substrate 100*d* is moved to the first process region 306*a*, the first purge region 307*a*, the second process region 306*b* and the second purge region 307*b* sequentially in this order.

A step S220 of starting a supply of the cleaning gas will be described. When the dummy substrate 100*d* is heated to a desired temperature and the rotation speed of the substrate placing plate 317 reaches and is maintained at a desired rotation speed, the valve 274 is opened to start the supply of the cleaning gas into the chamber 302. In the step S220, a flow rate of the cleaning gas is adjusted by the MFC 273 to a predetermined flow rate.

A cleaning step S230 will be described. In the cleaning step S230, the substrate placing plate 317 with the dummy substrates 100*d* placed thereon is rotated a predetermined number of times. In the cleaning step S230, by providing the cleaning gas to the substrate non-placing surface 325 of the substrate placing plate 317 and the outer peripheral portion 327 in the substrate placing surface 311 of the substrate placing plate 317 corresponding to the external region Edbs on the back surface of the dummy substrate 100*d*, it is possible to clean (remove) the film formed on the substrate non-placing surface 325 of the substrate placing plate 317 and the film thinly deposited on the outer peripheral portion 327 in the substrate placing surface 311 of the substrate placing plate 317. On the other hand, since the internal region Cdbs (that is, a portion of the back surface of the dummy substrate 100*d* excluding the external region Edbs) on the back surface of the dummy substrate 100*d* is in contact with an inner peripheral portion in the substrate placing surface 311 of the substrate placing plate 317, it is possible to prevent the inner peripheral portion in the substrate placing surface 311 from being exposed to the cleaning gas. As a result, it is possible to prevent (or suppress) the excessive cleaning of the substrate placing surface 311 of the substrate placing plate 317. Thereby, it is possible to extend the replacement period of the substrate placing plate 317. In addition, by removing the film deposited on the outer peripheral portion 327 in the substrate placing surface 311, it is possible to prevent (or suppress) the particles from being generated due to peeling-off of the film deposited on the outer peripheral portion 327.

A step S240 of stopping the supply of the cleaning gas will be described. After the substrate placing plate 317 is rotated the predetermined number of times, the valve 274 is closed to stop the supply of the cleaning gas.

A step S250 of stopping the rotation of the substrate placing plate 317 will be described. After the supply of cleaning gas is stopped according to the step S240, the rotation of the substrate placing plate 317 is stopped in the step S250.

The dummy substrate unloading step will be described. In FIG. 13, the illustration of the dummy substrate unloading step is omitted. The substrate placing plate 317 is rotated to move the dummy substrate 100*d* to be unloaded to the position facing the gate valve 305. Thereafter, the dummy substrate 100*d* to be unloaded is transferred (unloaded) out of the chamber 302 in a manner reverse to that of the dummy substrate loading and placing step. An operation described above is repeatedly performed until the entirety of the dummy substrates 100*d* are unloaded out of the chamber 302.

Second Embodiment

Figure 14:
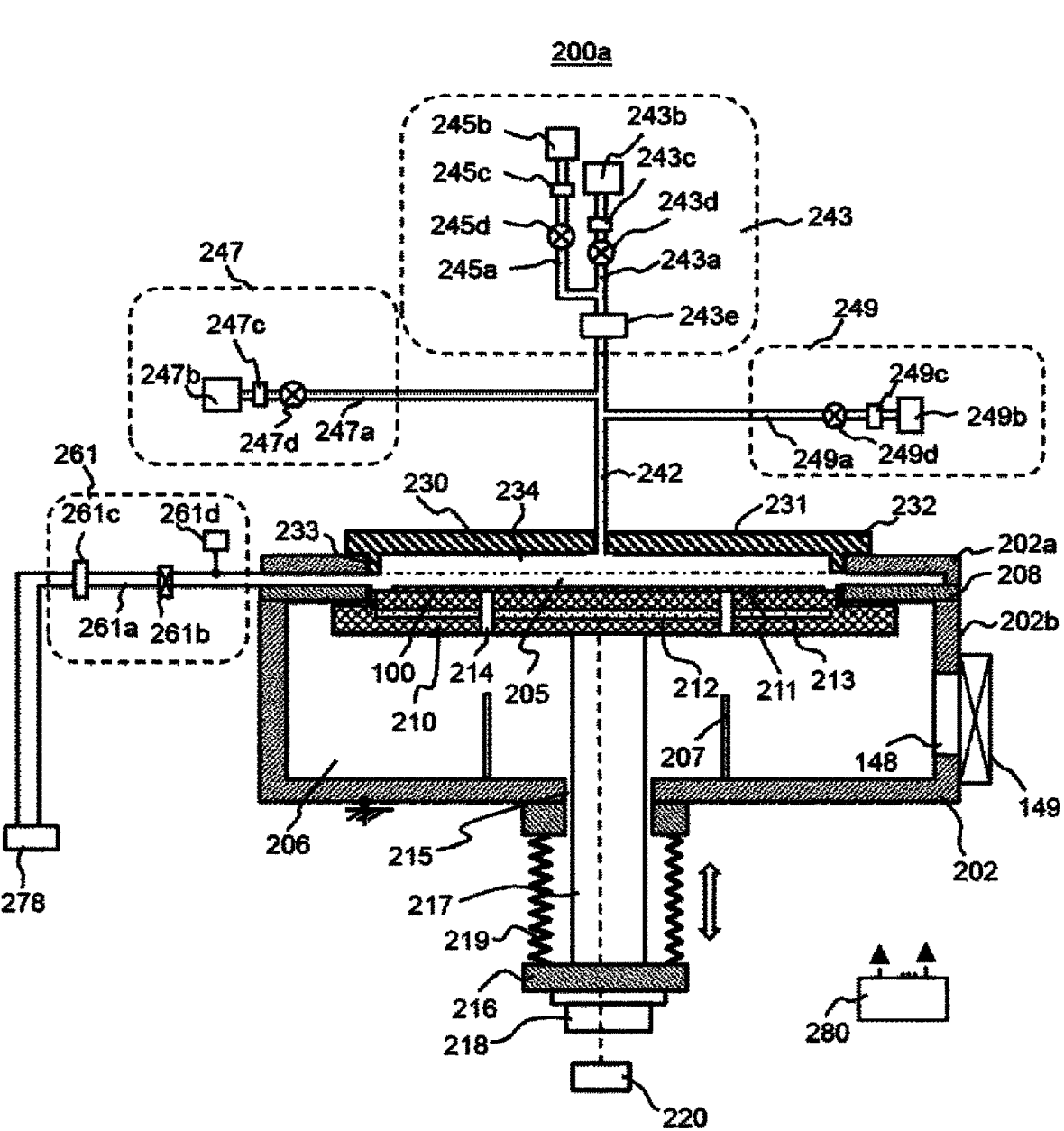
FIG. 14 is a diagram schematically illustrating an exemplary configuration of a substrate processing apparatus according to a second embodiment of the present disclosure.

Subsequently, a substrate processing apparatus according to a second embodiment will be described with reference to FIG. 14. FIG. 14 is a diagram schematically illustrating an exemplary configuration of the substrate processing apparatus according to the second embodiment of the present disclosure. A substrate processing apparatus 200*a* shown in FIG. 14 is an exemplary configuration of a single wafer type substrate processing apparatus in which a shower head 230 and a gas supply port (that is, a common gas supply pipe 242) are provided in a chamber 202. Although some of reference numerals (for example, 242, 243 and 261) of the substrate processing apparatus 200*a* shown in FIG. 14 are the same as some of reference numerals (for example, 242, 243 and 261) of the substrate processing apparatus 200 described with reference to FIGS. 7 through 10, components of the substrate processing apparatus 200*a* indicated by the reference numerals (for example, 242, 243, 261 and the like) are different from the components of the substrate processing apparatus 200 indicated by the reference numerals (for example, 242, 243, 261 and the like).

Chamber

First, the chamber 202 will be described. The substrate processing apparatus 200*a* includes the chamber 202. For example, the chamber 202 includes a flat and sealed vessel whose horizontal cross-section is circular. The chamber 202 is made of a metal material such as aluminum (Al) and stainless steel (SUS). A process space 205 in which the substrate 100 such as a silicon wafer is processed and a transfer space 206 through which the substrate 100 is transferred into or out of the process space 205 are provided in the chamber 202. The chamber 202 is constituted by an upper chamber 202*a* and a lower chamber 202*b*. A partition plate 208 is provided between the upper chamber 202*a* and the lower chamber 202*b*.

A substrate loading/unloading port 148 is provided adjacent to a gate valve 149 at a side surface of the lower chamber 202*b*. The substrate 100 is transferred between the transfer space 206 and a vacuum transfer chamber (not shown) through the substrate loading/unloading port 148. A plurality of lift pins 207 are provided at a bottom of the lower chamber 202*b*. In addition, the lower chamber 202*b* is electrically grounded.

A process chamber constituting the process space 205 is constituted by a substrate mounting table (which is a part of a substrate support 210) 212 and the shower head 230. The substrate support 210 configured to support the substrate 100 is provided in the process space 205. The substrate support 210 mainly includes: the substrate mounting table 212 provided with a substrate placing surface 211 on which the substrate 100 is placed; and a heater 213 serving as a heating source provided in the substrate mounting table 212. A plurality of through-holes 214 through which the lift pins 207 penetrate are provided at positions of the substrate mounting table 212 corresponding to the lift pins 207. A temperature controller 220 configured to control a temperature of the heater 213 is connected to the heater 213.

The substrate mounting table 212 is supported by a shaft 217. A support of the shaft 217 penetrates a hole 215 provided at a bottom wall of the chamber 202, and is connected to an elevator 218 provided at an outside of the chamber 202 via a support plate 216. The substrate 100 placed on the substrate placing surface 211 of the substrate mounting table 212 may be elevated or lowered by operating the elevator 218 by elevating or lowering the shaft 217 and the substrate mounting table 212. A bellows 219 covers a periphery of a lower end of the shaft 217 to maintain the process chamber 202 airtight.

When the substrate 100 is transferred, the substrate mounting table 212 is lowered until the substrate placing surface 211 faces the substrate loading/unloading port 148, that is, until a substrate transfer position of the substrate 100 is reached. When the substrate 100 is processed, the substrate mounting table 212 is elevated until the substrate 100 reaches a processing position (also referred to as a substrate processing position) in the process space 205 as shown in FIG. 14.

Specifically, when the substrate mounting table 212 is lowered to the substrate transfer position, upper ends of the lift pins 207 protrude from an upper surface of the substrate placing surface 211, and the lift pins 207 support the substrate 100 from thereunder. In addition, when the substrate mounting table 212 is elevated to the substrate processing position, the lift pins 207 are buried from the upper surface of the substrate placing surface 211 and the substrate placing surface 211 supports the substrate 100 from thereunder.

The shower head 230 is provided above (upstream side of) the process space 205. The shower head 230 includes a lid 231. The lid 231 includes a flange 232. The flange 232 is supported by the upper chamber 202*a*. The lid 231 also includes a position guiding protrusion 233. The lid 231 is fixed by the position guiding protrusion 233 being engaged with the upper chamber 202*a*.

The shower head 230 includes a buffer space 234. The buffer space 234 refers to a space defined by the lid 231 and the position guiding protrusion 233. The buffer space 234 is spatially in communication with the process space 205. A gas supplied into the buffer space 234 is diffused in the buffer space 234 and uniformly supplied to the process space 205. According to the present embodiment, the buffer space 234 and the process space 205 are separate spaces. However, the present embodiment is not limited thereto. For example, the buffer space 234 may be included in the process space 205.

The process space 205 is defined mainly by the upper chamber 202*a* and an upper structure of the substrate mounting table 212 at the substrate processing position. Structures defining the process space 205 may also be referred to as the process chamber. The structures defining the process space 205 are not limited to the above configuration as long as the process space 205 can be defined thereby.

The transfer space 206 is defined mainly by the lower chamber 202*b* and a lower structure of the substrate mounting table 212 at the substrate processing position. Structures defining the transfer space 206 may also be referred to as a "transfer chamber", and the transfer chamber is provided under the process chamber. The structures defining the transfer space 206 are not limited to the above configuration as long as the transfer space 206 can be defined thereby.

Gas Supplier

Subsequently, a gas supplier (which is a gas supply structure or a gas supply system) will be described. A first gas supply pipe 243*a*, a second gas supply pipe 247*a* and a third gas supply pipe 249*a* are connected to the common gas supply pipe 242.

A first process gas is supplied mainly through a first gas supplier (which is a first gas supply structure or a first gas supply system) 243 including the first gas supply pipe 243*a*. A second process gas (which is a cleaning gas) is supplied mainly through a second gas supplier (which is a second gas supply structure or a second gas supply system) 247 including the second gas supply pipe 247*a*. An inert gas is supplied mainly through a third gas supplier (which is a third gas supply structure or a third gas supply system) 249 including the third gas supply pipe 249*a*.

First Gas Supplier

A first gas supply source 243*b*, a mass flow controller (MFC) 243*c* serving as a flow rate controller (flow rate control structure) and a valve 243*d* serving as an opening/closing valve are provided at the first gas supply pipe 243*a* sequentially in this order from an upstream side to a downstream side of the first gas supply pipe 243*a* in a gas flow direction. A remote plasma structure (also referred to as a "remote plasma unit" or "RPU") 243*e* serving as a plasma generator is provided at a downstream side of the valve 243*d* of the first gas supply pipe 243*a* to activate the first process gas into a plasma state.

The first process gas is supplied into the shower head 230 via the first gas supply pipe 243*a* provided with the mass flow controller 243c and the valve 243d and the common gas supply pipe 242. The first process gas is activated into the plasma state by the RPU 243e.

The first process gas is one of process gases. For example, a silicon-containing gas is used as the first process gas. For example, dichlorosilane (SiH$_2$Cl$_2$, abbreviated as DCS) gas may be used as the silicon-containing gas.

The first gas supplier (also referred to as a "first process gas supplier") 243 is constituted mainly by the first gas supply pipe 243a, the MFC 243c, the valve 243d and the RPU 243e.

A downstream end of a nitrogen-containing gas supply pipe 245a is connected to the first gas supply pipe 243a at a downstream side of the valve 243d provided at the first gas supply pipe 243a. A nitrogen-containing gas supply source 245b, a mass flow controller (MFC) 245c serving as a flow rate controller (flow rate control structure) and a valve 245d serving as an opening/closing valve are provided at the nitrogen-containing gas supply pipe 245a sequentially in this order from an upstream side to a downstream side of the nitrogen-containing gas supply pipe 245a in the gas flow direction. A nitrogen-containing gas is supplied into the shower head 230 via the nitrogen-containing gas supply pipe 245a provided with the mass flow controller 245c and the valve 245d, the first gas supply pipe 243a and the RPU 243e.

For example, ammonia (NH$_3$) gas may be used as the nitrogen-containing gas.

A nitrogen-containing gas supplier (which is a nitrogen-containing gas supply structure or a nitrogen-containing gas supply system) is constituted mainly by the nitrogen-containing gas supply pipe 245a, the MFC 245c and the valve 245d. In addition, the nitrogen-containing gas supplier may further include the nitrogen-containing gas supply source 245b, the first gas supply pipe 243a and the RPU 243e. In addition, the first gas supplier 243 may further include the nitrogen-containing gas supplier.

Second Gas Supplier

A second gas supply source 247b, a mass flow controller (MFC) 247c serving as a flow rate controller (flow rate control structure) and a valve 247d serving as an opening/closing valve are provided at the second gas supply pipe 247a sequentially in this order from an upstream side to a downstream side of the second gas supply pipe 247a in the gas flow direction.

A gas containing a second element (hereinafter, also referred to as the "second process gas") is supplied into the shower head 230 via the second gas supply pipe 247a provided with the mass flow controller 247c and the valve 247d and the common gas supply pipe 242.

The second process gas is the cleaning gas containing a chlorine (Cl$_2$) gas, a fluorine (F$_2$) gas or both of the chlorine (Cl$_2$) gas and the fluorine (F$_2$) gas.

The second gas supplier (also referred to as a "second process gas supplier") 247 is constituted mainly by the second gas supply pipe 247a, the MFC 247c and the valve 247d. The second process gas supplier 247 may also be referred to as a "cleaning gas supplier 247" which is a cleaning gas supply structure or a cleaning gas supply system.

Third Gas Supplier

A third gas supply source 249b, a mass flow controller (MFC) 249c serving as a flow rate controller (flow rate control structure) and a valve 249d serving as an opening/closing valve are provided at the third gas supply pipe 249a sequentially in this order from an upstream side to a downstream side of the third gas supply pipe 249a in a gas flow direction.

The third gas supply source 249b is an inert gas supply source. As the inert gas, for example, nitrogen (N$_2$) gas may be used.

The third gas supplier 243 is constituted mainly by the third gas supply pipe 249a, the MFC 249c and the valve 249d.

The inert gas supplied from the third gas supply source (also referred to as "inert gas supply source") 249b acts as a purge gas of purging a residual gas in the chamber 202 or in the shower head 230 during a substrate processing described later.

Exhauster

An exhauster (which is an exhaust structure or an exhaust system) configured to exhaust an inner atmosphere of the chamber 202 is constituted mainly by a process space exhauster (which is a process space exhaust structure or a process space exhaust system) 261 configured to exhaust an inner atmosphere of the process space 205.

The process space exhauster 261 includes an exhaust pipe 261a connected to the process space 205. The exhaust pipe 261a is spatially in communication with the process space 205. An APC (Automatic Pressure Controller) 261c serving as a pressure regulator (which is a pressure adjusting structure) configured to adjust an inner pressure of the process space 205 to a predetermined pressure and a first pressure detector 261d of detecting the inner pressure of the process space 205 are provided at the exhaust pipe 261a. The APC 261c includes an adjustable valve body (not shown). The APC 261c is configured to adjust a conductance of the exhaust pipe 261a in accordance with an instruction from a controller 280 shown in FIG. 14. A valve 261b is provided at an upstream side of the APC 261c provided at the exhaust pipe 261a. The exhaust pipe 261a, the valve 261b, the APC 261c and the first pressure detector 261d are collectively referred to as the process space exhauster 261.

A dry pump (DP) 278 is provided at a downstream side of the exhaust pipe 261a. The DP 278 exhausts the inner atmosphere of the process space 205 via the exhaust pipe 261a.

In the substrate processing apparatus 200a, it is possible to form a silicon nitride film (also referred to as an "SiN film") serving as a film on the substrate 100 by performing the substrate processing of the present embodiment. In addition, it is possible to clean the substrate mounting table 212 by performing a cleaning process of the present embodiment. When cleaning the substrate mounting table 212 by performing the cleaning process of the present embodiment, the cleaning gas is supplied through the cleaning gas supplier 247 to the chamber 202 while the dummy substrate 100d described with reference to FIG. 2 being placed on the substrate placing surface 211 of the substrate mounting table 212 shown in FIG. 14.

According to the embodiments described above, it is possible to provide one or more of the following effects.

a) Since the cleaning gas is supplied through the cleaning gas supplier while the dummy substrate being placed on the substrate support, it is possible to prevent the substrate placing surface of the substrate support from being exposed to the cleaning gas.

b) The dummy substrate is configured such that the outer periphery of the dummy substrate is not in contact with the substrate support when the dummy substrate is placed on the substrate support. As a result, it is possible to clean (remove) the film thinly deposited on the outer peripheral portion of the substrate placing surface of the substrate support.

c) By a) and b) described above, it is possible to prevent (or suppress) the excessive cleaning of the substrate placing surface of the substrate support.

d) By c) described above, it is possible to extend the replacement period of the substrate support.

e) Since the film deposited on the outer peripheral portion of the substrate placing surface can be removed, it is possible to prevent (or suppress) the particles from being generated due to peeling-off of the film deposited on the outer peripheral portion of the substrate placing surface.

Other Embodiments

While the technique of the present disclosure is described in detail by way of the embodiments described above, the technique of the present disclosure is not limited thereto. The technique of the present disclosure may be modified in various ways without departing from the scope thereof.

According to some embodiments of the present disclosure, it is possible to cleaning the film deposited on the outer peripheral portion of the substrate placing surface of the substrate support.

What is claimed is:

1. A substrate processing apparatus comprising:
a substrate support having a plurality of substrate placing surfaces that is each configured to support a product substrate in a concentric manner;
a process gas supplier through which a process gas is supplied to the plurality of substrate placing surfaces while the product substrate is placed thereon;
a cleaning gas supplier through which a cleaning gas is supplied to the plurality of substrate placing surfaces;
a dummy substrate placed on each substrate placing surface; and
a rotator configured to rotate the substrate support,
wherein the dummy substrate is configured such that an outer peripheral portion of the dummy substrate is out of contact with each substrate placing surface in a state where the dummy substrate is placed on each substrate placing surface, the outer peripheral portion of the dummy substrate is provided with a plurality of through-holes penetrating from a front surface thereof to a back surface thereof, a width of a region of the outer peripheral portion of the dummy substrate closer to an exhaust buffer structure provided at an outer periphery of the substrate support is greater than that of a region of the outer peripheral portion of the dummy substrate closer to a center of the substrate support, and the cleaning gas is supplied to the plurality of substrate placing surfaces via the plurality of through-holes of the dummy substrate while the dummy substrate is placed on each substrate placing surface.

2. The substrate processing apparatus of claim 1, wherein a width of the outer peripheral portion of the dummy substrate is equal to or greater than 5 mm.

3. The substrate processing apparatus of claim 1, wherein a thickness of the outer peripheral portion of the dummy substrate decreases toward an outer periphery of the dummy substrate.

4. The substrate processing apparatus of claim 1, wherein a shape of the front surface of the outer peripheral portion of the dummy substrate is different from that of the back surface of the outer peripheral portion of the dummy substrate.

5. The substrate processing apparatus of claim 1, wherein the plurality of through-holes comprise at least four through-holes.

6. The substrate processing apparatus of claim 1, wherein
a shape of a near-center region of the outer peripheral portion of the dummy substrate relatively closer to the center of the substrate support is different from that of a near-periphery region of the outer peripheral portion of the dummy substrate relatively closer to the outer periphery of the substrate support.

7. The substrate processing apparatus of claim 1, wherein a width of a near-center region of the outer peripheral portion of the dummy substrate relatively closer to the center of the substrate support is different from that of a near-periphery region of the outer peripheral portion of the dummy substrate relatively closer to the outer periphery of the substrate support.

8. The substrate processing apparatus of claim 7, wherein a width of a region of the outer peripheral portion of the dummy substrate closer to the outer periphery of the substrate support is greater than that of the region of the outer peripheral portion of the dummy substrate closer to the center of the substrate support.

9. The substrate processing apparatus of claim 1, wherein a thickness of a near-center region of the outer peripheral portion of the dummy substrate relatively closer to the center of the substrate support is different from that of a near-periphery region of the outer peripheral portion of the dummy substrate relatively closer to the outer periphery of the substrate support.

10. The substrate processing apparatus of claim 9, wherein the thickness of the near-periphery region of the outer peripheral portion of the dummy substrate is less than that of the near-center region of the outer peripheral portion of the dummy substrate.

11. A non-transitory computer-readable recording medium storing a program that causes, by a computer, a substrate processing apparatus to perform:
(a) placing a dummy substrate on each of a plurality of substrate placing surfaces in the substrate processing apparatus, wherein the substrate processing apparatus comprises: a substrate support where the plurality of substrate placing surfaces, on each of which a product substrate is placed, are arranged in a concentric manner; a process gas supplier through which a process gas is supplied to the plurality of substrate placing surfaces while the product substrate is placed thereon and the substrate support is rotated; a cleaning gas supplier through which a cleaning gas is supplied to the plurality of substrate placing surfaces while the dummy substrate is placed on each substrate placing surface; and a rotator configured to rotate the substrate support, wherein the dummy substrate is configured such that an outer peripheral portion of the dummy substrate is out of contact with each substrate placing surface in a state where the dummy substrate is placed on each substrate placing surface, the outer peripheral portion of the dummy substrate is provided with a plurality of through-holes penetrating from a front surface thereof to a back surface thereof, a width of a region of the outer peripheral portion of the dummy substrate closer to an exhaust buffer structure provided at an outer periphery of the substrate support is greater than that of a region of the outer peripheral portion of the dummy substrate closer to a center of the substrate support, and the cleaning gas is supplied to the plurality of substrate placing surfaces via the plurality of through-holes of the dummy substrate while the dummy substrate is placed on each substrate placing surface;

(b) exhausting the process gas through the exhaust buffer structure; and (c) supplying the cleaning gas through the cleaning gas supplier.

12. The non-transitory computer-readable recording medium of claim 11, wherein a width of the outer peripheral portion of the dummy substrate is equal to or greater than 5 mm.

13. The non-transitory computer-readable recording medium of claim 11, wherein a shape of a front surface of the outer peripheral portion of the dummy substrate is different from that of a back surface of the outer peripheral portion of the dummy substrate.

14. The non-transitory computer-readable recording medium of claim 11, wherein the plurality of through-holes comprise at least four through-holes.

15. A substrate processing method comprising:

(a) placing a dummy substrate on each of a plurality of substrate placing surfaces in a substrate processing apparatus, wherein the substrate processing apparatus comprises: a substrate support having the plurality of substrate placing surfaces, on each of which a product substrate is placed, are arranged in a concentric manner; a process gas supplier through which a process gas is supplied to the plurality of substrate placing surfaces while the product substrate is placed thereon and the substrate support is rotated; a cleaning gas supplier through which a cleaning gas is supplied to the plurality of substrate placing surfaces while the dummy substrate is placed on each substrate placing surface; and a rotator configured to rotate the substrate support, wherein the dummy substrate is configured such that an outer peripheral portion of the dummy substrate is out of contact with each substrate placing surface in a state where the dummy substrate is placed on each substrate placing surface, the outer peripheral portion of the dummy substrate is provided with a plurality of through-holes penetrating from a front surface thereof to a back surface thereof, a width of a region of the outer peripheral portion of the dummy substrate closer to an exhaust buffer structure provided at an outer periphery of the substrate support is greater than that of a region of the outer peripheral portion of the dummy substrate closer to a center of the substrate support, and the cleaning gas is supplied to the plurality of substrate placing surfaces via the plurality of through-holes of the dummy substrate while the dummy substrate is placed on each substrate placing surface;

(b) exhausting the process gas through the exhaust buffer structure; and (c) supplying the cleaning gas through the cleaning gas supplier.

16. The substrate processing method of claim 15, wherein a width of the outer peripheral portion of the dummy substrate is equal to or greater than 5 mm.

17. The substrate processing method of claim 15, wherein a shape of a front surface of the outer peripheral portion of the dummy substrate is different from that of a back surface of the outer peripheral portion of the dummy substrate.

18. The substrate processing method of claim 15, wherein the plurality of through-holes comprise at least four through-holes.

19. A method of manufacturing a semiconductor device comprising the substrate processing method of claim 15.

20. A dummy substrate used for the substrate processing apparatus of claim 1.

* * * * *